(12) United States Patent
Shih et al.

(10) Patent No.: US 10,873,020 B2
(45) Date of Patent: Dec. 22, 2020

(54) PIEZOELECTRIC SENSING APPARATUS AND METHOD

(71) Applicant: Texas Instruments Incorporated, Dallas, TX (US)

(72) Inventors: Wei-Yan Shih, Plano, TX (US); Sudhanshu Khanna, Plano, TX (US); Michael Zwerg, Dallas, TX (US); Juergen Luebbe, Fairview, TX (US); Gregory Allen North, Austin, TX (US); Steven C. Bartling, Dallas, TX (US); Leah Trautmann, Longmont, CO (US); Scott Robert Summerfelt, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 595 days.

(21) Appl. No.: 15/671,252

(22) Filed: Aug. 8, 2017

(65) Prior Publication Data
US 2019/0051812 A1 Feb. 14, 2019

(51) Int. Cl.
| | |
|---|---|
| H01L 41/09 | (2006.01) |
| H01L 41/107 | (2006.01) |
| H01L 41/113 | (2006.01) |
| G01H 11/08 | (2006.01) |
| B06B 1/06 | (2006.01) |
| H01L 41/04 | (2006.01) |
| H01L 41/047 | (2006.01) |

(52) U.S. Cl.
CPC ............. *H01L 41/107* (2013.01); *B06B 1/06* (2013.01); *G01H 11/08* (2013.01); *H01L 41/042* (2013.01); *H01L 41/047* (2013.01); *H01L 41/1132* (2013.01)

(58) Field of Classification Search
CPC ... H01L 41/107; H01L 41/042; H01L 41/047; H01L 41/1132; B06B 1/08; G01H 11/08
USPC ......................................... 310/311–371, 800
See application file for complete search history.

(56) References Cited

U.S. PATENT DOCUMENTS

| | | | |
|---|---|---|---|
| 2007/0068267 A1 | 3/2007 | Kurtz et al. | |
| 2010/0188107 A1* | 7/2010 | Khanna .................... | G01D 5/24 324/686 |
| 2010/0277040 A1 | 11/2010 | Klee et al. | |
| 2012/0319529 A1 | 12/2012 | Nakazawa et al. | |
| 2019/0058106 A1* | 2/2019 | Meng ................... | H01L 41/1132 |
| 2019/0162590 A1* | 5/2019 | Zwerg ..................... | G01H 11/08 |
| 2020/0168786 A1* | 5/2020 | Khanna ............... | H01L 41/0805 |

FOREIGN PATENT DOCUMENTS

JP  2012199325 A  10/2012

OTHER PUBLICATIONS

International Search Report for PCT/US2018/045875 dated Nov. 15, 2018.

* cited by examiner

*Primary Examiner* — Thomas M Dougherty
(74) *Attorney, Agent, or Firm* — Michael A. Davis, Jr.; Charles A. Brill; Frank D. Cimino

(57) ABSTRACT

A piezoelectric sensor with: (i) a capacitive element, comprising piezoelectric material; (ii) a pre-conditioning circuit, comprising circuitry for establishing a polarization of the capacitive element in a polarizing mode; and (iii) signal amplification circuitry for providing a piezoelectric-responsive output signal, in response to charge across the capacitive element in a sensing mode.

20 Claims, 14 Drawing Sheets

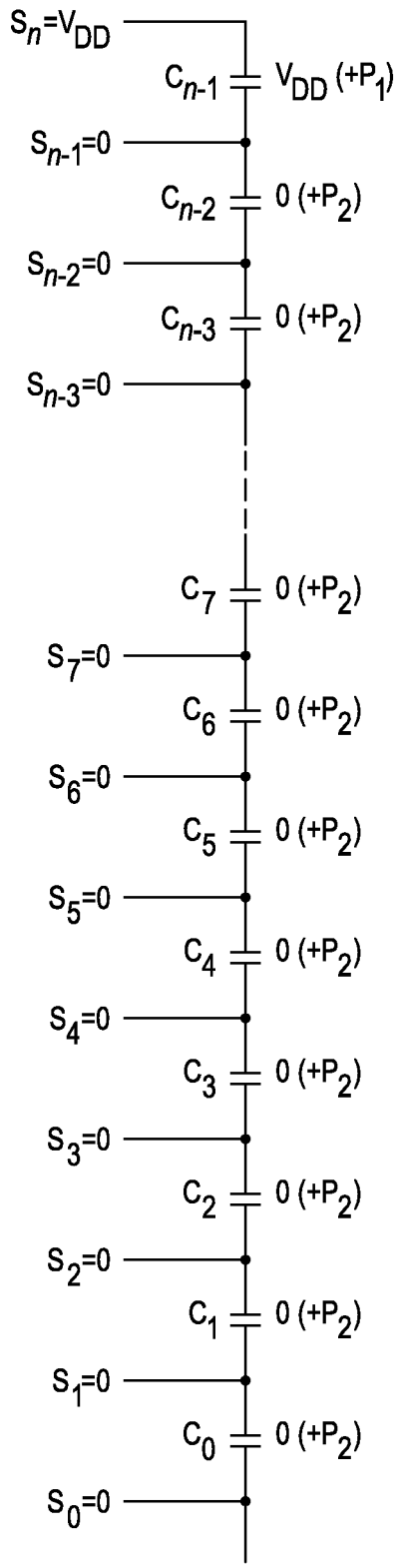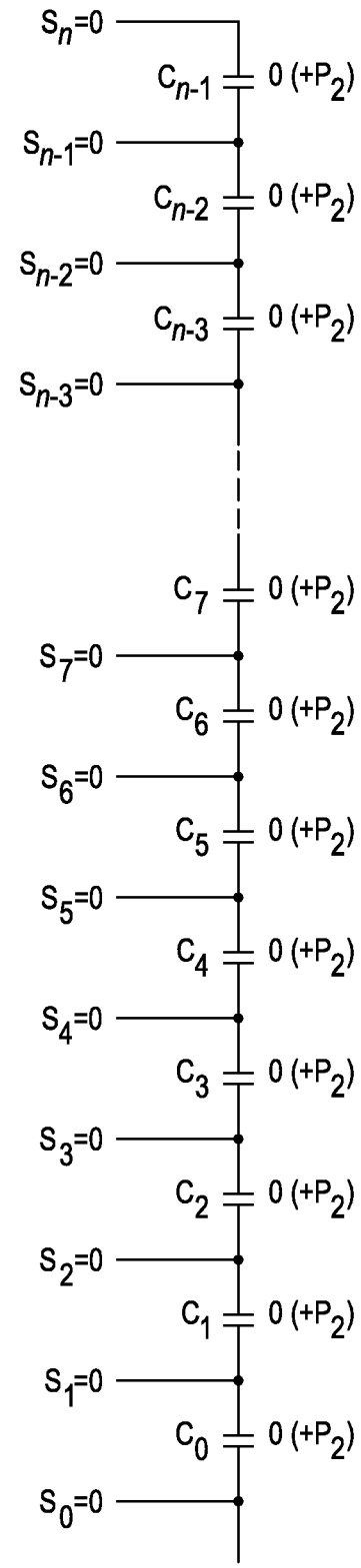
FIG. 10C
FIG. 10D

PIEZOELECTRIC SENSING APPARATUS AND METHOD

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to piezoelectric sensors and, more particularly, to a piezoelectric sensor apparatus and method.

Vibration sensors have various uses and are implemented in the art in various fashions. Piezoelectric devices are sometimes referred to as PZT, referring to the lead zirconate titanate that is a very commonly used piezoelectric ceramic material. A contemporary piezoelectric sensor often includes a discrete piezoelectric sensor coupled to an analog front end (AFE) for signal conditioning. While such an approach may serve the function of providing an electrical signal in response to a vibration or other force or environmental effect imposed on the piezoelectric sensor, such an approach has various drawbacks. Such drawbacks can include size or bulk, expense, and an undesirably large amount of power consumption necessary to bias the sensor-to-AFE interface within an operating window. In addition, discrete sensors may be preconditioned for polarity at the time of manufacture, but such polarity, and hence device accuracy, may degrade due to change in temperature, passage of time, and response to long term effects of the magnitudes of force applied to the device. Still further, discrete sensors may experience signal leakage due, for example, to the piezoelectric itself, electrostatic discharge (ESD) circuitry for the AFE, as well as that of wires and related electronics, and leakage therefore reduces signal strength in response to vibrations, where small signal detection may be critical for low vibration (i.e., low frequency) detection.

Thus, while the prior art approaches have served various needs, the present inventors seek to improve upon the prior art, as further detailed below.

BRIEF SUMMARY OF THE INVENTION

In an embodiment, there is a piezoelectric sensor, comprising an integrated circuit comprising a substrate. Affixed relative to the substrate are: (i) a capacitive element, comprising piezoelectric material; (ii) a pre-conditioning circuit, comprising circuitry for establishing a polarization of the capacitive element in a polarizing mode; and (iii) signal amplification circuitry for providing a piezoelectric-responsive output signal, in response to charge across the capacitive element in a sensing mode.

In another embodiment, there is a piezoelectric sensor, comprising: (i) a capacitive element, comprising a plurality of serially-connected piezoelectric capacitors; (ii) a pre-conditioning circuit, comprising circuitry for establishing a polarization of the capacitive element in a polarizing mode; and (iii) signal amplification circuitry for providing a piezoelectric-responsive output signal, in response to charge across the capacitive element in a sensing mode.

Numerous other inventive aspects are also disclosed and claimed.

BRIEF DESCRIPTION OF THE SEVERAL VIEWS OF THE DRAWING

FIGS. 10A through 10D illustrates a simplified and partial view of the capacitor stack of FIG. 1, with the application of different signal iterations of the FIG. 9 method.

DETAILED DESCRIPTION OF EMBODIMENTS

Figure 1:
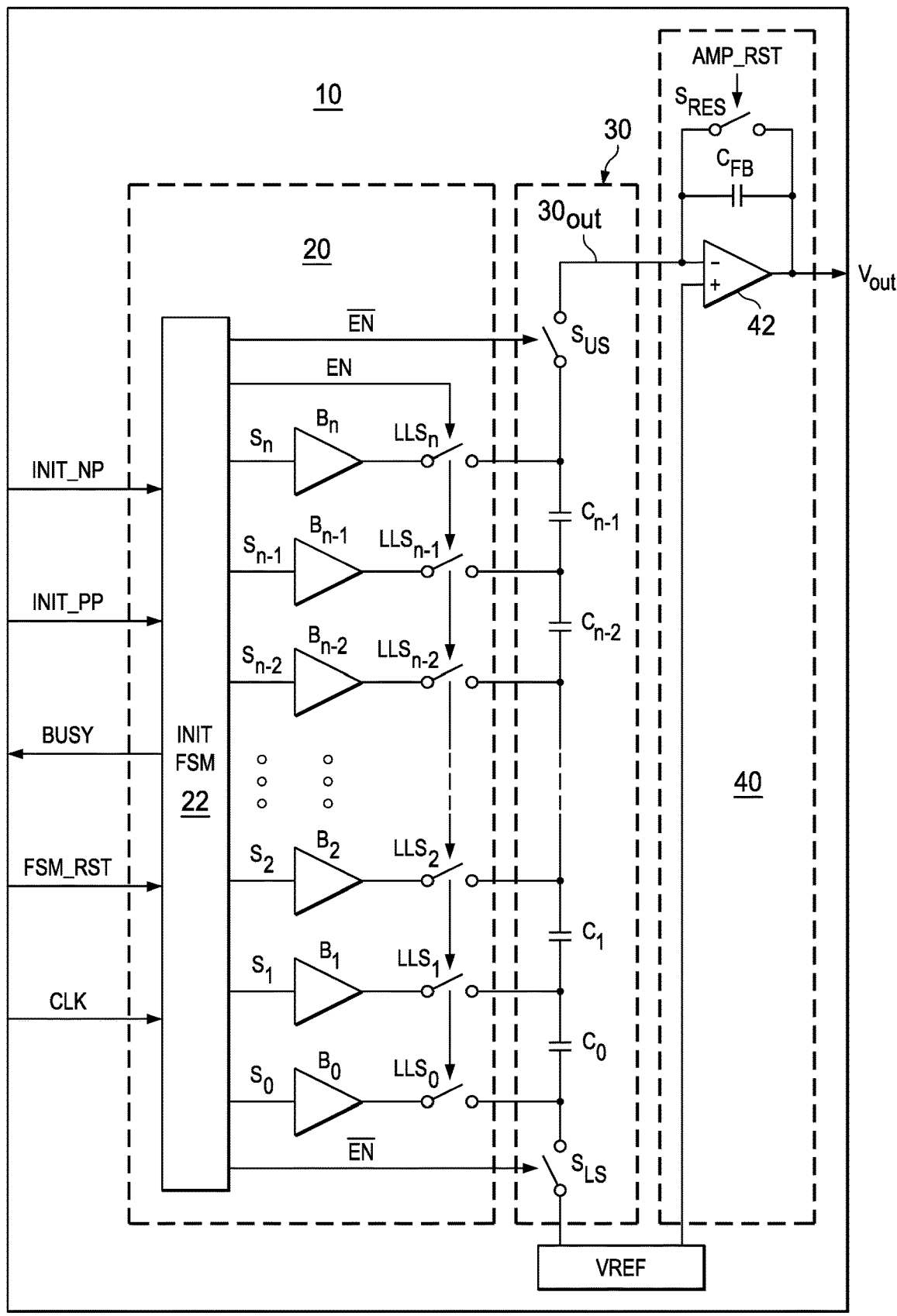
FIG. 1 illustrates an electrical block and schematic diagram of a preferred embodiment piezoelectric sensor.

FIG. 1 illustrates an electrical block and schematic diagram of a preferred embodiment piezoelectric sensor 10. By way of introduction, sensor 10 may be generally described as including three stages, namely: (i) a precondition circuit 20; (ii) a piezoelectric capacitor element in the form of a stack 30 (the piezoelectric sensing element is referred as "capacitive element" or sometimes "capacitor" due to its capacitive behavior when connected to an electrical circuit); and (iii) a sensor output circuit 40. Each of these three stages is further described below. Further, from that description, one skilled in the art will appreciate that each stage as detailed may be implemented in connection with a single integrated circuit, that is, the present preferred embodiments are capable of full integration into a monolithic structure, such as in connection with a single integrated circuit substrate. In this regard, the devices and functionality as detailed in this document are all within the current technological processes for forming integrated circuit devices. Indeed, certain of these aspects notably depart from the prior art, where, for example, preconditioning and or analog front end structures may arise as separate devices. These and other aspects are further explored, below.

Precondition circuit 20 preferably includes an initialization finite state machine (INIT FSM) 22 as may be constructed by one skilled in the art, such as via logic gates, a controller, or the like. INIT FSM 22 achieves state transitions or sequential operations, as detailed later in connection with communicating n+1 poling signals $S_0$ through $S_n$ ultimately to piezoelectric capacitor stack 30. Note that the term poling introduces that each such signal is operable to contribute to the polarization of a capacitor in stack 30. In a preferred embodiment example, INIT FSM 22 receives four input signals, namely: (i) a clock signal CLK; (ii) a reset signal FSM_RST; (iii) a negative polarization signal INIT_NP; and (iv) a positive polarization initialization signal INIT_PP. INIT FSM 22 also includes a number of output signals. One set of such signals output includes the poling signals $S_0$ through $S_n$, each of which is connected as an input to a respective buffer $B_0$ through $B_n$, and the output of each buffer $B_x$ is connected as an input to a respective low leakage switch $LLS_0$ through $LLS_n$. INIT FSM 22 also outputs an enable signal EN (and its complement, $\overline{EN}$), as a switch control as detailed later. Lastly, INIT FSM 22 has a BUSY output signal, for indicating that the INIT FSM 22 is in an active state (i.e., not in idle state).

Piezoelectric capacitor stack 30 includes a number n of serially-connected capacitors, indicated $C_0$ through $C_{n-1}$, referred to as a stack to connote the serial connection between successive capacitors, that is, an upper electrode of capacitor $C_0$ is connected to a lower electrode of capacitor $C_1$, an upper electrode of capacitor $C_1$ is connected to a lower electrode of capacitor $C_2$, and so forth up through an upper electrode of capacitor $C_{n-2}$ being connected to a lower electrode of capacitor $C_{n-1}$. In different preferred embodiments, the value of n may be selected by one skilled in the art based on various considerations arising from the teachings of this document, where as examples, $3 \leq n \leq 64$. For connecting poling signals and as described later, the number n of capacitors $C_x$ is preferably one less than the number of buffers $B_x$ (and low leakage switches $LLS_x$). Preferably, each capacitor $C_x$ is a ferroelectric capacitors, also referred to in the art as an FeCap. Also preferably, all capacitors $C_x$ are constructed relative to a single semiconductor device, where in a preferred embodiment each capacitor lower electrode is in a same first fabrication layer, each capacitor ferroelectric layer is in a same second fabrication layer, and each capacitor upper electrode is in a same third fabrication layer, with appropriate connectivity (e.g., through metallization) between one capacitor upper electrode and a next capacitor lower electrode. In this regard, environmental factors, including processing, temperature, and physical stresses, will be more uniformly applied across all n capacitors, so as to provide greater accuracy in the piezoelectric response achieved by piezoelectric capacitor stack 30. Concluding the connectivity of stack 30, the lower electrode of capacitor $C_0$ is connected (in addition to switch $LLS_0$ described above) through a lower stack switch $S_{LS}$ to a reference voltage VREF, and the upper electrode of capacitor $C_{n-1}$ is connected (in addition to switch $LLS_n$ described above) through an upper stack switch $S_{US}$ to an output $30_{out}$ of stack 30. Both stack switches $S_{LS}$ and $S_{US}$ are controlled by $\overline{EN}$, that is, when $\overline{EN}$ is asserted, each such switch closes, and when $\overline{EN}$ is de-asserted, each such switch opens.

Sensor output circuit 40 includes a differential amplifier 42, which for purposes of illustration is shown as a single operational amplifier, but which could include multiple amplification stages. The inverting input of amplifier 42 is connected to output $30_{out}$ of stack 30. The non-inverting input of amplifier 42 is connected to VREF, which was introduced earlier as connected to the lower electrode of capacitor $C_0$ in stack 30. Note now that VREF is preferably between the rail voltages (not shown, but inherent to amplifiers) of amplifier 42, as typically referred to in the part as $V_{DD}$ and $V_{SS}$, where $V_{SS}$ may be ground. A feedback capacitor $C_{FB}$ is connected from the output $v_{out}$ of amplifier 42 and the inverting input of amplifier 42, where output $v_{out}$ also serves as the output for sensor 10. As known in the operational amplifier art, the ratio between the sensor stack (30) capacitance and capacitor $C_{FB}$ is essentially a capacitive voltage divider and determines the amplifier gain. Note, however, that if amplifier 42 is not an operational amplifier, the circuit can be very different. In addition, a reset switch, $S_{RES}$, is connected in parallel with feedback capacitor $C_{FB}$, whereby switch $S_{RES}$ is operable to close in response to a signal AMP_RST for purposes of defining a DC bias point by asserting AMP_RST, initializing node $30_{out}$, and then de-asserting AMP_RST after which AC voltage is properly divided as between CFB and stack 30. Further in this regard, therefore, switch $S_{RES}$ allows for compensating in that the operational amplifier circuit does not have resistive feedback, so any charge accumulation across capacitor $C_{FB}$ (due to leakage of any source) can cause $v_{out}$ to drift. Accordingly, AMP_RST can be asserted: (i) before sensing mode starts; (ii) periodically to mitigate drift; or (iii) when large $v_{out}$ offset is observed, where the last two scenarios also apply to temperature changes.

The operation of piezoelectric sensor 10 is now described in general, followed by some illustrative examples of various operations and additional aspects with later Figures.

In general, sensor 10 operates in what will be referred to herein as two different modes. A first mode, namely a polarization mode, preconditions sensor 10, in large part in response to precondition circuit 20, so as to co-align the ferroelectric polarization in capacitors $C_0$ through $C_{n-1}$ in a same direction. The resultant aligned polarity provides a desirable constructive addition of sensitivity of each capacitor, for example, improving signal to noise (SNR) response. Note that the first mode may be achieved in connection with the manufacturing of sensor 10, that is, by the manufacturer and prior to release of the device to a user/consumer and prior to its implementation in the field. Additionally, however, preferred embodiments permit later repetition of the precondition steps, thereby permitting a subsequent reconditioning (i.e., refresh) of the polarization in capacitor stack 30; thus, after the passage of time and exposure of sensor 10 to other influences (e.g., operational, environmental), the preconditioning step may be repeated, once again toward aligning most or all of the ferroelectric polarization in the capacitors of stack 30 in a same direction. A second mode, namely a piezoelectric sensing mode, permits sensing, by the piezoelectric material of stack 30, for producing a responsive electrical signal $v_{out}$ to one or more conditions imposed on the piezoelectric material. In this regard, piezoelectric sensors may be used in numerous applications, as known or ascertainable by one skilled in the art. Examples of such applications include measuring change of strain, pressure, stress, acceleration, temperature (using the pyroelectric behavior of the sensing material), or force, which is imposed on stack 30 and converted by amplifier 42 into the electrical signal $v_{out}$. Given the preceding and as further detailed below, after an instance of the polarization mode, either from preconditioning by the manufacturer of sensor 10, or after a repeat of those steps as a reconditioning or re-alignment of polarization of sensor 10, then sensor 10 may be operated to provide output signal, $v_{out}$.

Figure 2:
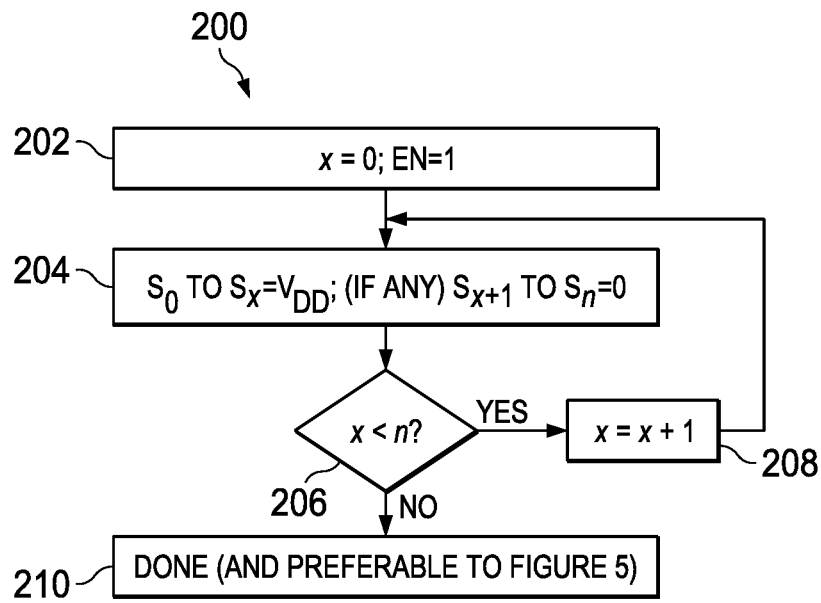
FIG. 2 illustrates a preferred embodiment method that may be used in a polarization mode of the FIG. 1 sensor to establish a first polarity direction and first polarization magnitude.

Having introduced the polarization mode either in connection with manufacture or later (e.g., in-the-field) use of sensor 10, FIG. 2 illustrates a preferred embodiment method 200 of steps that may be used in the polarization mode. Method 200 commences with step 202, in which an index x is established so as to facilitate looping through a total of n+1 iterations of a sequence, as controlled in part by index x. Also during this iteration, as established for example in step 202, EN=1, thereby closing all of the low leakage switches $LLS_0$ through $LLS_n$, so that poling signals $S_0$ through $S_n$ are connected to respective nodes in capacitor stack 30. Note that with EN=1, its complement is $\overline{EN}$=0, thereby opening switches $S_{US}$ and $S_{LS}$, and isolating capacitor stack 30 from sensor output circuit 40. After this index initialization, method 200 continues from step 202 to step 204.

Figure 4:
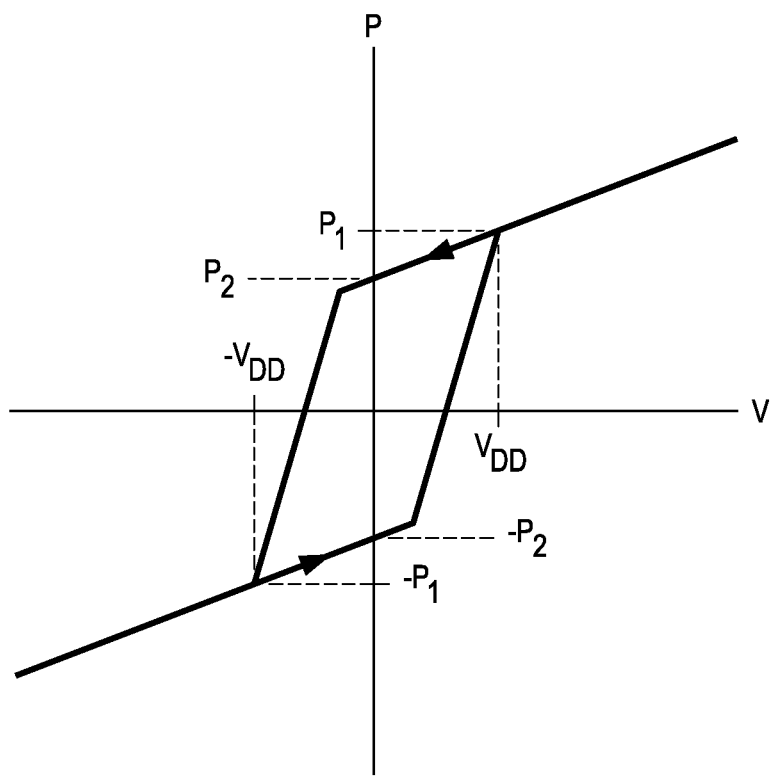
FIG. 4 generally depicts a hysteresis aspect of the ferroelectric material of the FIG. 1 capacitor stack.
Figure 3A:
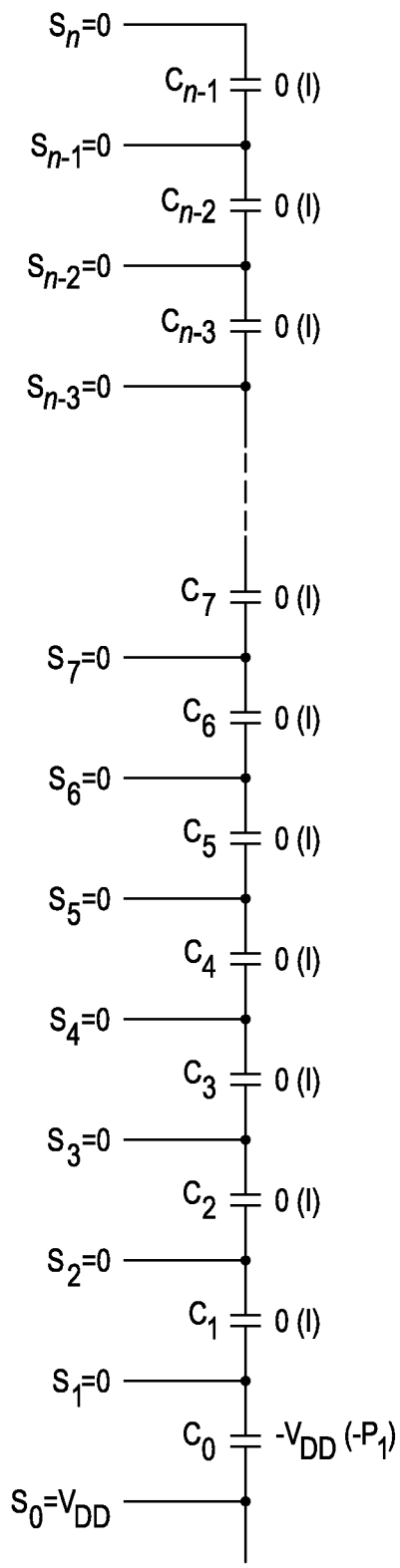
FIGS. 3A through 3D illustrates a simplified and partial view of the capacitor stack of FIG. 1, with the application of different signal iterations of the FIG. 2 method.

In step 204, a first subset of poling signals $S_0$ through $S_n$, namely, $S_0$ to $S_x$, are set to $V_{DD}$, while a second subset of poling signals, namely, the remaining $S_{x+1}$ to $S_n$, are set to ground (shown as zero volts). By way of example, therefore, for the first iteration of step 204 (i.e., x=0 from step 202), then the first subset of signals has $S_0=V_{DD}$, while the second and remaining poling signals $S_1$ through $S_n$ all equal 0. To further illustrate this example, FIG. 3A illustrates a simplified and partial view of capacitor stack 30, with the application of the first iteration of these signals as described. Thus, with $S_0=V_{DD}$ and $S_1=0$, note therefore that the voltage across capacitor $C_0$ is $-V_{DD}$, as shown to the right of the capacitor in FIG. 3A. At the same time, however, with the remaining $S_{x+1}$ to $S_n$ equal to ground, then each of the other capacitors $C_1, \ldots, C_{n-1}$ has a voltage of 0 volts across it, as also shown to the right of each of those capacitors. Additionally in FIG. 3A, to the right of the voltage across each capacitor is shown a parenthetical, which is now further explored. Specifically, as known in the art, a ferroelectric material will polarize in response to energy (e.g., voltage) applied to it, and the general nature of the response curve demonstrating such polarization is shown by way of example in FIG. 4, which is not drawn to scale but generally depicts a hysteresis aspect as is relevant to an understanding of the inventive scope. Specifically, FIG. 4 illustrates voltage (V) along its horizontal axis and material polarization (P) along its vertical axis. With hysteresis, however, the ferroelectric polarization at 0 volts depends on the direction of the voltage as it approached the 0 volt point, namely, for a voltage that was negative and increases toward 0 volts, then at 0 volts the ferroelectric polarization is at a level shown as $-P_2$, whereas for a voltage that was positive and decreases toward 0 volts, then at 0 volts the ferroelectric polarization is at a level shown as $P_2$. Note that FIG. 4 is drawn symmetrically for sake of simplifying the illustration, discussion, and understanding, so that $-P_2$ has the same magnitude as $P_2$. Due to the fabrication sequence, however, it is more likely that the positive and negative polarization magnitudes are different when a capacitor is subjected to either $V_{DD}$ or $-V_{DD}$. Thus, in addition to the simplified presentation, one skilled in the art should appreciate that also possible is $|-P_1| \neq P_1$ and $|-P_2| \neq P_2$. In any event, returning to FIG. 3A, therefore, for the first instance of step 202 from FIG. 2, the voltage across capacitor $C_0$ is $-V_{DD}$, so the polarization across that device is $-P_1$. Note for sake of reference that capacitors $C_1, \ldots C_{n-1}$, that is, that the capacitors above capacitor $C_0$ in stack 30, will not yet have been intentionally polarized in response to a voltage signal and therefore the parenthetical indication of "I" shown in FIG. 3A (and later figures) is intended to indicate an indeterminate state.

Figure 3B:
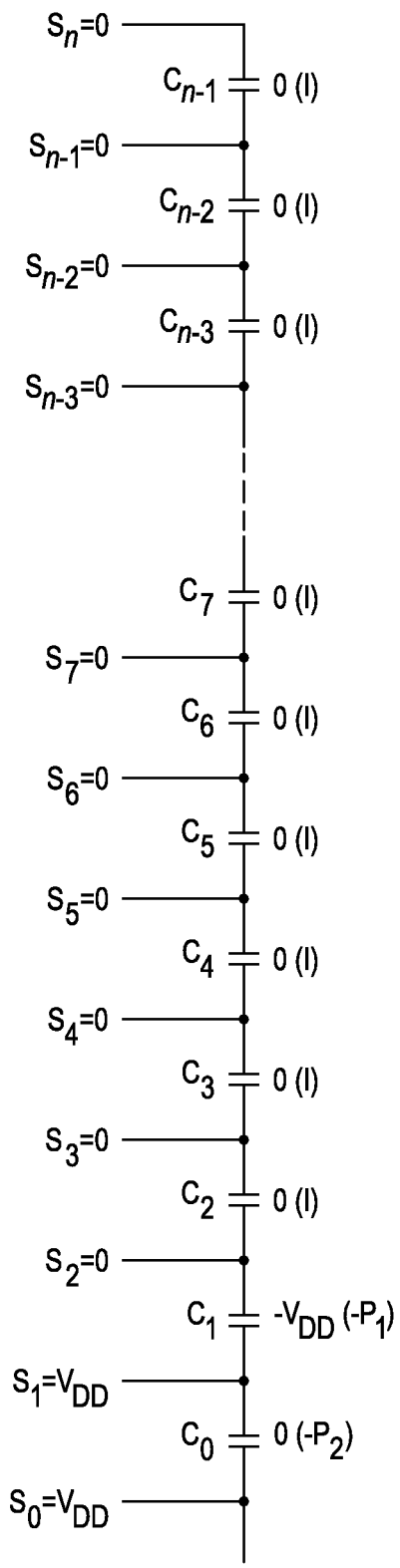

Following step 204, method 200 continues to step 206, which compares the loop index x to see if it is less than (i.e., has not completed) all of the n+1 of poling signals $S_0$ through $S_n$. If the loop index x is less than n, then method 200 proceeds to step 208, which increments the loop index x and returns flow to step 204, whereas if the loop index x is no longer less than n, then method 200 proceeds to step 210 to complete the method, which also as shown can then transition to a method 500 of FIG. 5, detailed later. Given the looping operation as has been now described, one skilled in the art will appreciate that for each increase in loop index x, then one at a time, from the bottom of stack 30 upward, each successive capacitor $C_x$ will receive a voltage of ground at its upper electrode, with a voltage of $V_{DD}$ at its lower electrode, thereby causing the capacitor, in response to those respective voltages, to attain a polarization of $-P_1$. In addition, however, note now the additional operation once the loop index x equals one or more. Specifically, FIG. 3B illustrates the biasing signals and polarization of capacitor stack 30 when the method 200 loop index x equals one. Per step 204, therefore, the first subset of poling signals is $S_0$ through $S_1$ and equal $V_{DD}$, while the second subset of poling signals is $S_2$ through $S_n$, and equal zero volts. Again, therefore, the capacitor $C_x$, which for x equals 1, is $C_1$, receives ground at its upper electrode and $V_{DD}$ at its lower electrode, polarizing the capacitor at $-P_1$; note, however, the effect of the loop on the capacitor immediately below capacitor $C_x$ in the serial path, that is, at capacitor $C_{x-1}$, which in the current example is capacitor $C_0$. For that capacitor, both its upper and lower electrodes are now at $V_{DD}$, so the voltage across the capacitor, formerly at $-V_{DD}$ for the immediately preceding iteration of x=x-1, is now switched to 0 volts. According to the hysteresis response of FIG. 4, therefore, the polarization across the capacitor will recede in magnitude, but not change polarity, from $-P_1$ to $-P_2$. Hence, for the iteration of method 200 when x=1, the polarization of capacitor $C_0$ is $-P_2$, while the polarization of capacitor $C_1$ is $-P_1$.

Figure 3C:
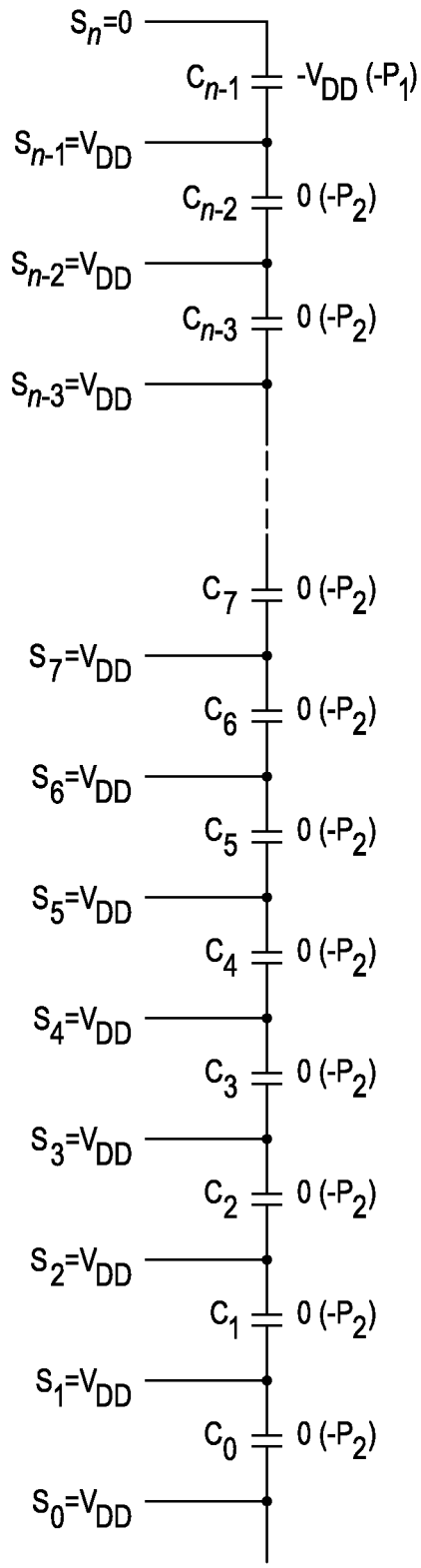
Figure 3D:
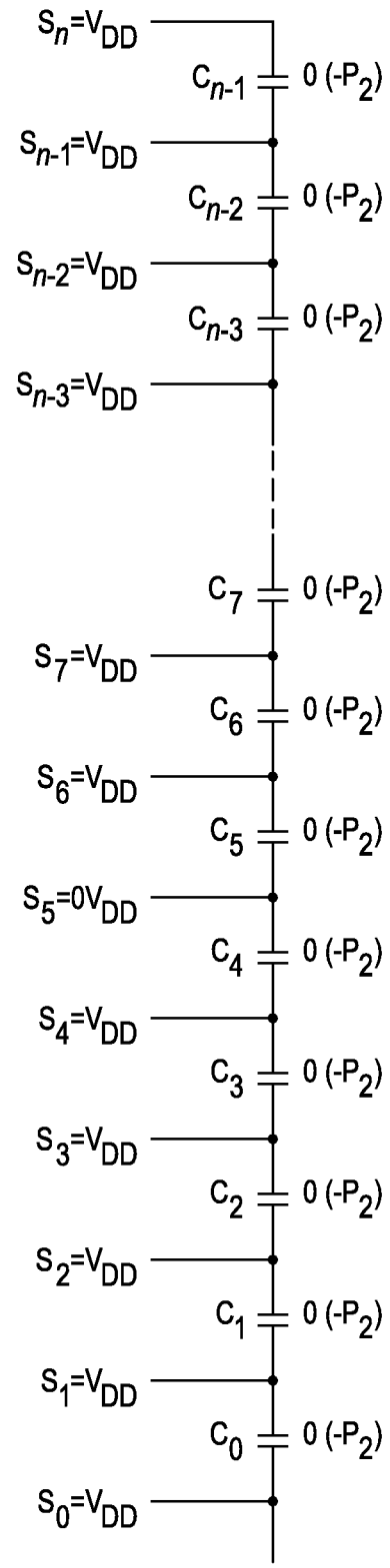

Given the preceding, one skilled in the art will appreciate that for each successive loop iteration x of method 200, one additional capacitor at a time (e.g., per CLK of INIT FSM 22 of FIG. 1), compared to the immediately preceding iteration x-1, will achieve a polarization of $-P_1$, with each capacitor below that additional capacitor having achieved a polarization of $-P_2$. FIG. 3C, by way of example, therefore illustrates the loop iteration for x=n-1, in which case all poling signals in a first subset from $S_0$ to $S_{n-1}$ equal $V_{DD}$, while the remaining poling signal in the second subset, namely $S_n$, equals 0. Thus, following those n-1 loop iterations, all capacitors $C_0$ through $C_{n-2}$ will be polarized to $-P_2$, while capacitor $C_{n-1}$ will be polarized to $-P_1$. Further, for the iteration of x=n-1, then step 206 is still satisfied, so step 208 is repeated one more time to increment x=n and step 204 is repeated, with the result being that illustrated in FIG. 3D. Specifically, in this final loop iteration of method 200, wherein x=n, then all poling signals in a first subset from $S_0$ to $S_n$ equal $V_{DD}$, while the remaining subset is the null set, as there are no additional poling signals having an index greater than n. Further, therefore, in this iteration for x=n, $S_n=V_{DD}$, whereas in the immediately preceding iteration of x=n-1 then $S_n=0$, so whereas capacitor $C_{n-1}$ was polarized to $-P_1$ for the iteration of x=n-1 in response to a voltage across it of $-V_{DD}$, when x=n then the voltage of $S_n = S_{n-1} = V_{DD}$ increases the voltage across capacitor $C_{n-1}$ from $-V_{DD}$ to zero, thereby causing it to polarize, as indicated by the response curve in FIG. 4, to a polarization of $-P_2$. Thus, for x=n, capacitor $C_{n-1}$ remains negatively polarized, and is now polarized in a same direction and same magnitude as all other capacitors in stack 30.

From the above, one skilled in the art should appreciate that method 200 commences with 0 volts across each capacitor in stack 30, and then from a direction in ascending index x for capacitor $C_x$ in the capacitors $C_0$ up to $C_{n-1}$, then one capacitor a time and for that index is biased to a first polarity having a first magnitude and a first direction, and then in a successive ascension of the index to x+1 that same capacitor is further biased to maintain that same first polarity direction, albeit changing, potentially, by some difference in magnitude. Given that the sequence of such changing biases may be perceived as from the bottom of stack 30 (i.e., as to capacitor $C_0$, closest to VREF), in an upward direction in the schematic sense of stack 30 (i.e., toward capacitor $C_{n-1}$, the top electrode of which is the stack output $v_{out}$), then the process may be perceived as akin to an upward zipper of values, where each ascendant step of the zipper is the new application of $V_{DD}$ to a next selected capacitor upper electrode in the serial chain, thereby moving that capacitor to a negative polarity while ensuring the capacitor(s) below the selected capacitor also maintain(s) a likewise, and earlier established, negative polarity. Accordingly, as the figurative zipper moves up, the magnitude of the polarization across each capacitor may recede, but it will not change state (i.e., from negative to positive or vice versa) by virtue of the sequencing of the preferred embodiment. As a result, upon completion of method 200, all capacitors in the stack have co-aligned directionality of polarization.

Figure 5:
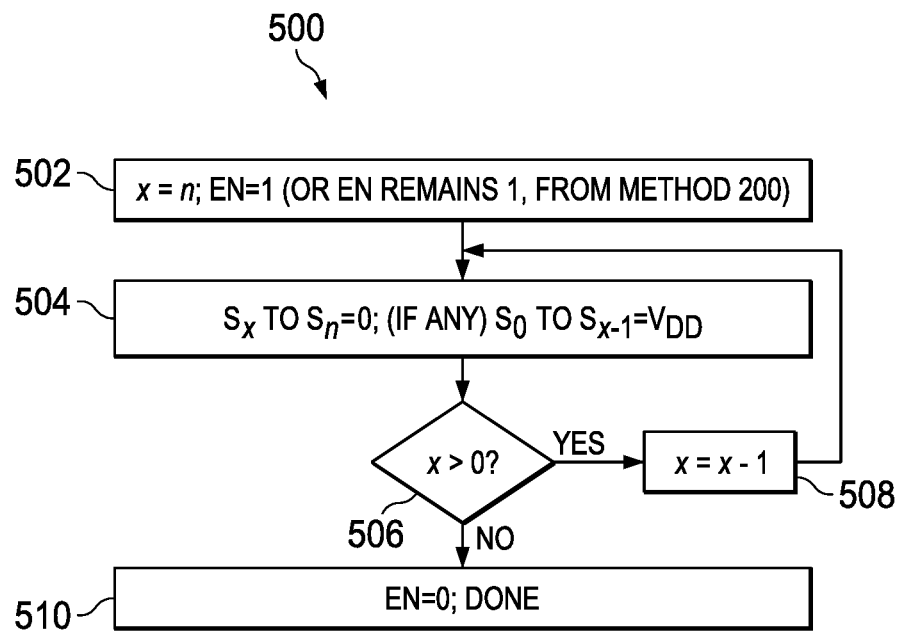
FIG. 5 illustrates a preferred embodiment method that may be used in a polarization mode of the FIG. 1 sensor to maintain the first polarity direction and establish a second polarization magnitude.

Having introduced a preferred embodiment bottom-upward, negative polarization of capacitor stack 30 mode, a preferred embodiment further contemplates a defined sequence to prevent random events, such as the possibility of a change in polarity direction, while removing the non-zero biases applied by poling signals $S_0$ through $S_n$, to capacitor stack 30. In this regard, FIG. 5 illustrates a preferred embodiment method 500 of steps that may be used in sequentially removing the non-zero poling signals in a controlled defined manner, so as to reduce or eliminate issues that may arise from otherwise uncontrolled discharge events. Method 500 commences with a step 502, in which the loop index x is initialized to n, that is, the number of the topmost poling signal $S_n$, again to facilitate a sequential looping through a total of n+1 iterations for the n+1 poling signals, but here in a decrementing fashion so as to sequence from the top of capacitor stack 30 downward. Meanwhile, again for step 502 (as was the case for method 200 of FIG. 2), EN=1, thereby closing all of the low leakage switches $LLS_0$ through $LLS_n$, so that poling signals $S_0$ through $S_n$ are connected to respective nodes in capacitor stack 30 (and $\overline{EN}$=0 keeps switches $S_{US}$ and $S_{LS}$ open). After this index initialization, method 500 continues from step 502 to step 504.

Figure 6A:
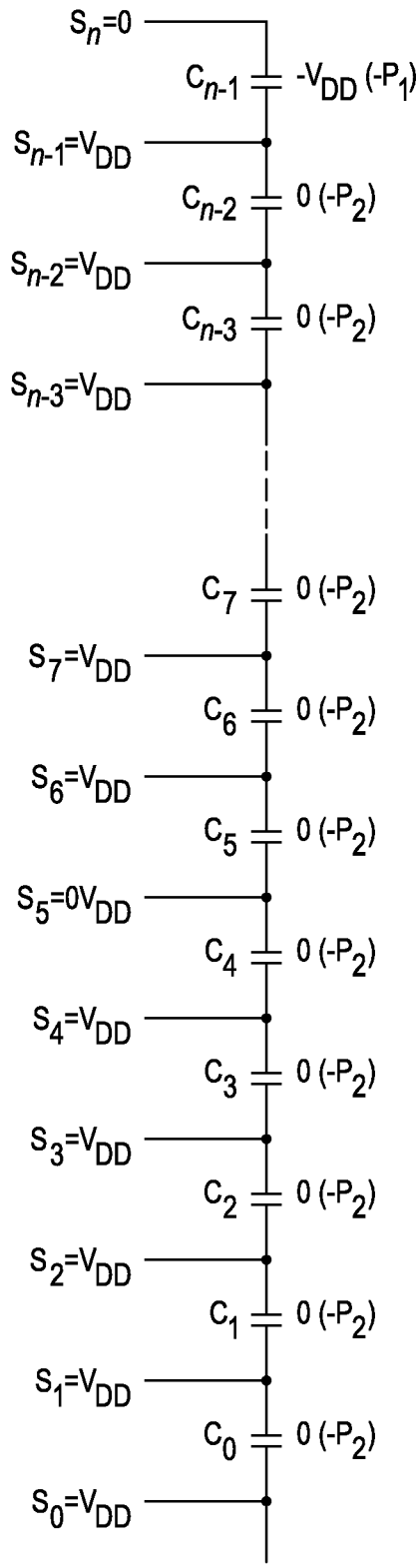
FIGS. 6A through 6D illustrates a simplified and partial view of the capacitor stack of FIG. 1, with the application of different signal iterations of the FIG. 5 method.

In step 504, a first subset of the poling signals $S_0$ through $S_n$, namely, $S_0$ to $S_{x-1}$, are set to $V_{DD}$ (or maintained at $V_{DD}$, as the preferred example, from method 200) while a second subset of the poling signals $S_x$ through $S_n$, being the remaining poling signals not included in the first subset and, therefore, $S_x$ to $S_n$, are set to ground (shown as zero volts). By way of example, therefore, for the first iteration of step 504 (i.e., x=n from step 502), then the first subset of signals has $S_0$ through $S_{n-1}$ equal to $V_{DD}$, while the second subset and remaining poling signal $S_n$, equals 0. To further illustrate this example, FIG. 6A again illustrates the simplified and partial view of capacitor stack 30 as used in FIGS. 3A through 3D, but here with the application of poling signals from method 500. Thus, in FIG. 6A, with $S_n$=0 and $S_{n-1}$=$V_{DD}$, the voltage across capacitor $C_{n-1}$ is $-V_{DD}$, as shown to the right of the capacitor in FIG. 6A. At the same time, however, with the remaining $S_0$ to $S_{x-1}$ equal to $V_{DD}$, then each of the other capacitors $C_0, \ldots, C_{n-2}$ has a voltage of 0 volts across it, as also shown to the right of each of those capacitors. Additionally in FIG. 6A, to the right of the voltage across each capacitors is again shown a parenthetical with the resultant polarization, given the teachings of FIG. 4. Accordingly, from the first instance of step 504, the voltage of $-V_{DD}$ across capacitor $C_{n-1}$ results in a ferroelectric material polarization of $-P_1$. For the remaining capacitors $C_0, \ldots C_{n-2}$, that is, that the capacitors below capacitor $C_{n-1}$ in stack 30, those capacitors will have been formerly polarized to $-P_2$ by the earlier application of method 200 and therefore the parenthetical indication of "$-P_2$" is shown in FIG. 6A (and later figures, where applicable).

Figure 6B:
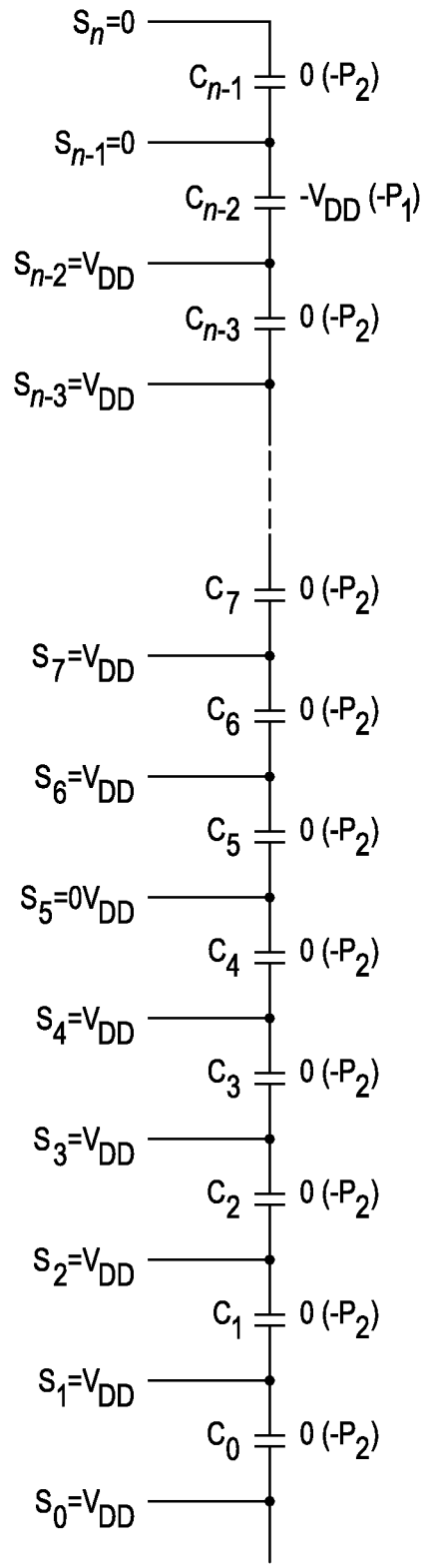
Figure 6C:
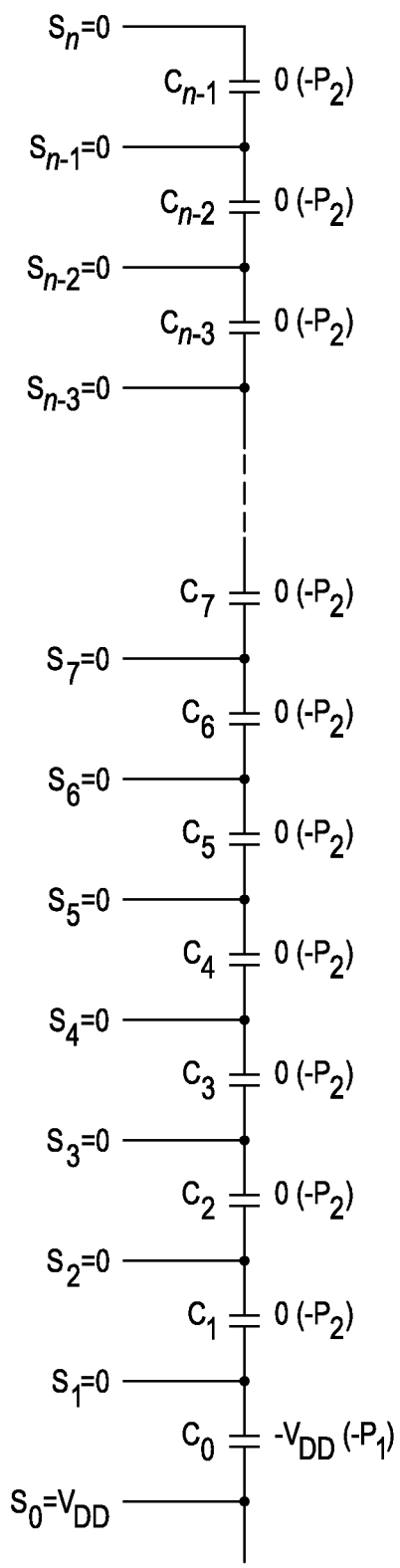
Figure 6D:
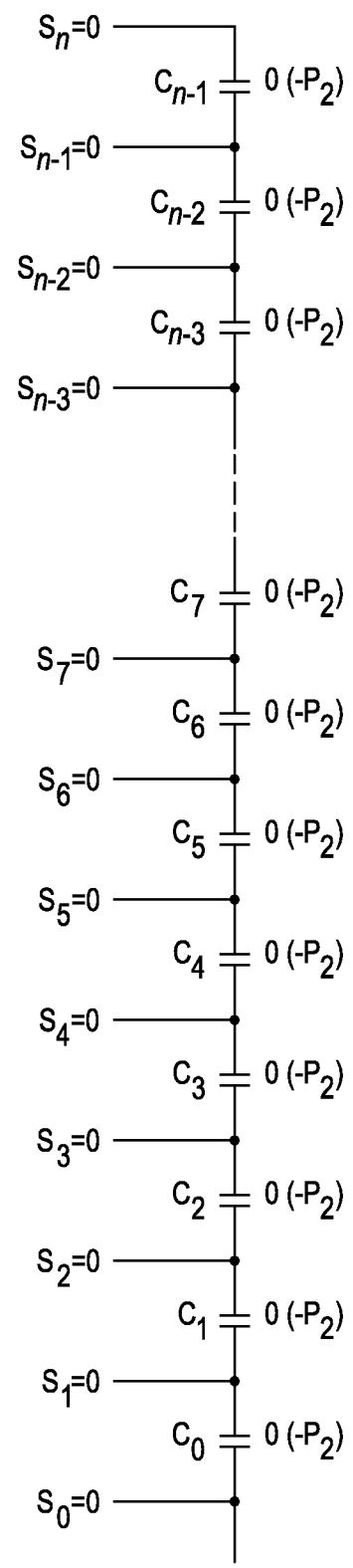

Following step 504, method 500 continues to step 506, which compares the loop index x to see if it has reached zero, that is, in effect determining whether the bottommost poling signals $S_n$ has been processed in the loop. If the loop index x is greater than zero, then method 500 proceeds to step 508 which decrements the loop index x and returns flow to step 504, whereas if the loop index x reaches (i.e., is equal to) zero, then method 500 proceeds to step 510 in which EN is set to zero so as to complete the method and whereby its complement thereby closes switches $S_{US}$ and $S_{LS}$. Given the looping operation as now has been described, one skilled in the art will appreciate that for each decrease in loop index x, then from the top of stack 30 downward, each successive capacitor $C_x$ will receive a voltage of 0 at its upper electrode, with a voltage of $V_{DD}$ at its lower electrode, thereby causing the capacitor, in response to those respective voltages, and the $-V_{DD}$ difference between them, to achieve a polarization of $-P_1$. Such operations, and the results arising from the steps and signals, also will be appreciated by one skilled in the art given the additional illustrations of FIGS. 6B through 6D. Specifically, FIG. 6B illustrates the biasing signals and polarization of capacitor stack 30 when the method 500 loop index x equals n-1. Thus, $S_{n-1}$ equals 0 at the upper electrode of capacitor $C_{n-2}$, while $S_{x-1}$ (i.e., $S_{(n-1)-1}$=$S_{n-2}$) equals $V_{DD}$ at the bottom electrode of capacitor $C_{n-2}$, polarizing the capacitor at $-P_1$. Note, however, the effect of the loop on the capacitor above capacitor $C_{n-2}$, that is, at capacitor $C_{n-1}$. For that capacitor, both its upper and lower electrodes are now at 0 volts, so the voltage across the capacitor, formerly at $-V_{DD}$ for the immediately preceding iteration of x=n, is now switched to 0 volts. Hence, per FIG. 4, the polarity direction of the capacitor does not change, while the polarization magnitude of the capacitor changes from $-P_1$ to $-P_2$. FIG. 6C illustrates the biasing signals and polarization of capacitor stack 30 when the method 500 loop index x equals 1, and FIG. 6D illustrates the biasing signals and polarization of capacitor stack 30 when the method 500 loop index x equals 0. By the last step as therefore illustrated in FIG. 6D, each capacitor, formerly having a polarization of $-P_1$ for one cycle wherein there is $-V_{DD}$ across it, has for a next loop then had 0 volts applied across both its upper and lower electrodes, there changing the polarization from $-P_1$ to $-P_2$, in an orderly, sequential and controlled fashion, so as to discharge the signal applied to the device while ensuring the polarization remains negative and, therefore, does not switch state to a positive polarization.

From the above, note that method 200 essentially achieves a uniform negative polarization of $-P_2$ across each capacitor in stack 30 (see, FIG. 3D), by sequentially polarizing each successive capacitor in a first direction (e.g., bottom upward) across stack 30, and method 500 controllably preserves that negative polarization of $-P_2$ across each capacitor in stack 30 (see, FIG. 6D), by sequentially discharging both capacitor electrodes to ground for each successive capacitor in a second direction (e.g., top downward), opposite the first direction. As a result, preferred embodiment scope permits the polarization of sensor 10 at one or more times as introduced earlier, and in a way to improve signal performance of the device.

Figure 7:
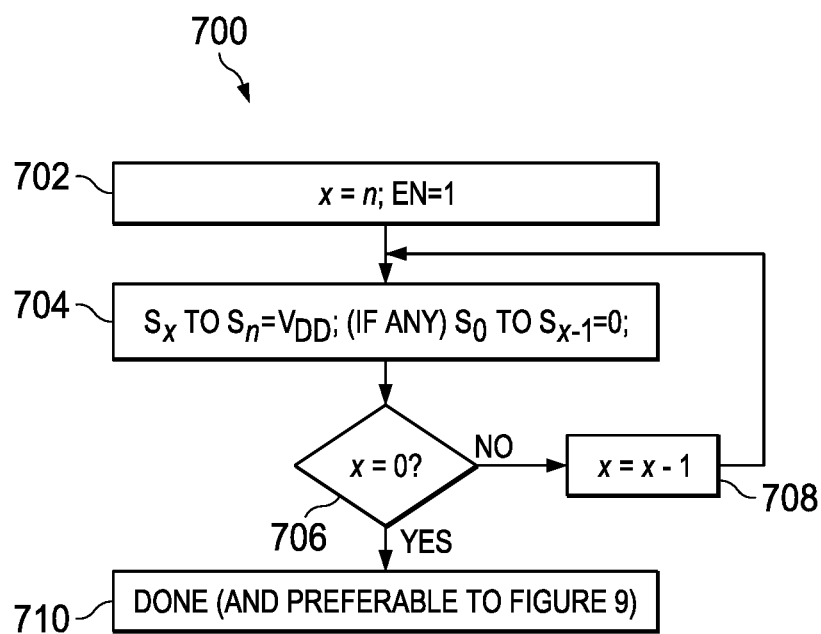
FIG. 7 illustrates a preferred embodiment method that may be used in a polarization mode of the FIG. 1 sensor to establish a second polarity direction and third polarization magnitude.

In lieu of, or in addition to, the above-described polarization starting with grounded capacitor plates and sequencing in a bottom upward direction of applying $V_{DD}$ to one additional capacitor electrode per a loop iteration, in a preferred embodiment a comparable method, with reverse resultant polarity, is achieved by starting with grounded capacitor plates and sequencing in a top downward direction of applying $V_{DD}$ to one additional capacitor electrode per a loop iteration. Further in this regard, FIG. 7 illustrates a preferred embodiment method 700 of steps that also may be used in the polarization mode. Method 700 commences with a step 702, in which index x is again set to loop through a total of n+1 iterations of a sequence, as controlled in part by index x, and again EN=1 during method 700 to close the low leakage switches $LLS_0$ through $LLS_n$ and thereby connect poling signals $S_0$ through $S_n$ to respective nodes/electrodes in capacitor stack 30. After this index initialization, method 700 continues from step 702 to step 704.

Figure 8A:
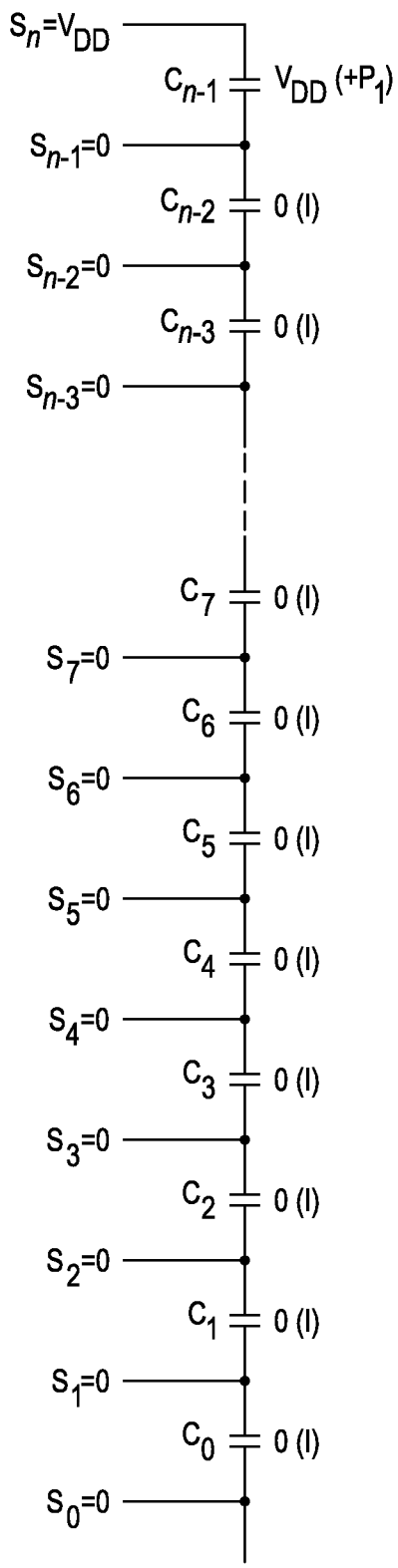
FIGS. 8A through 8D illustrates a simplified and partial view of the capacitor stack of FIG. 1, with the application of different signal iterations of the FIG. 7 method.

In step 704, a first subset of poling signals $S_0$ through $S_n$, namely, $S_0$ to $S_{x-1}$, are set to ground (zero volts), while a second subset of poling signals $S_x$ through $S_n$ are set to $V_{DD}$. By way of example, therefore, for the first iteration of step 704 (i.e., x=n from step 702), then the first subset of signals has $S_0$ through $S_{n-1}$ equal to ground, while the second and remaining poling signal $S_n$ equals $V_{DD}$. To further illustrate this example, FIG. 8A illustrates these poling signals, using the same conventions as explained in earlier Figures. Thus, with $S_n=V_{DD}$ and $S_{n-1}=0$, the voltage across capacitor $C_{n-1}$ is $V_{DD}$, and its polarity is therefore set to $+P_1$. At the same time, the remaining $S_0$ to $S_{n-2}$ poling signals equal ground so that each of the other capacitors $C_0, \ldots, C_{n-2}$ has a voltage of 0 volts across it, with potentially an indeterminate poling.

Figure 8B:
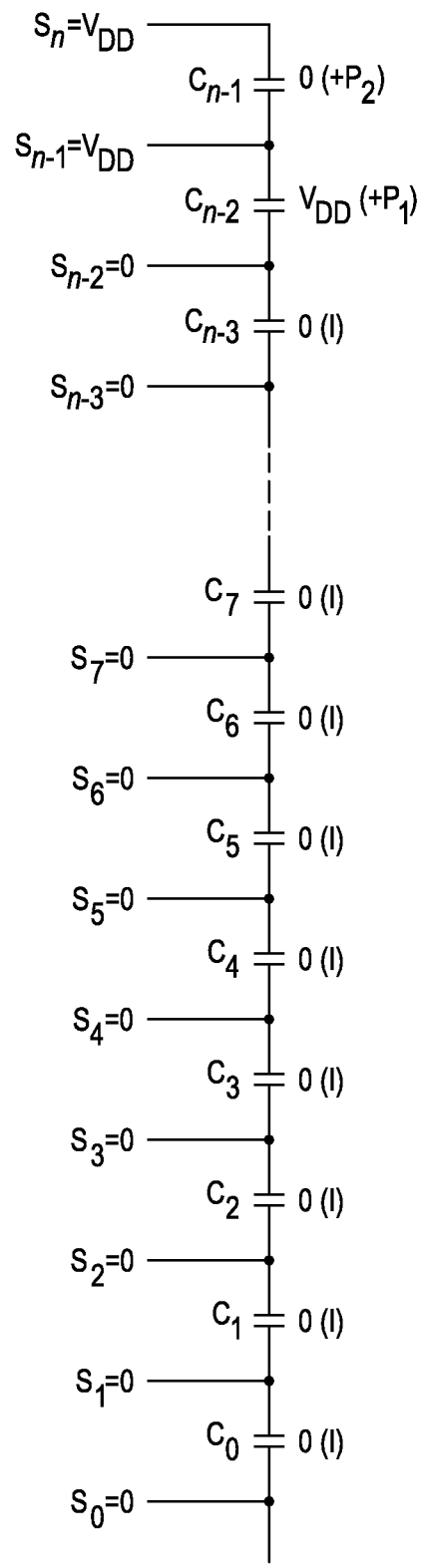

Following step 704, method 700 continues to step 706, which compares the loop index x to see if it has reached zero, that is, whether the index has processed the lowest poling signal $S_0$. If the loop index x is greater than zero, then method 700 proceeds to step 708 which decrements the loop index x and returns flow to step 704, whereas if the loop index x has reached zero, then method 700 proceeds to step 710 to complete the method, which also as shown can then transition to a method 900 of FIG. 9, detailed later. Given the looping operation as has been now described, one skilled in the art will appreciate that for each decrease in loop index x, then from the top of stack 30 downward, each successive capacitor $C_x$ will receive a voltage of $V_{DD}$ at its upper electrode, with a voltage of 0 at its lower electrode, thereby causing the capacitor, in response to those respective voltages, to attain a polarization of $+P_1$. In addition, however, note now the additional operation once the loop index x is decremented one or more times. Specifically, FIG. 8B illustrates the biasing signals and polarization of capacitor stack 30 when the method 700 loop index x equals n−1. Per step 704, therefore, the first subset of poling signals is $S_0$ through $S_{n-2}$, which equal 0, while the second subset of poling signals is $S_{n-1}$ through $S_n$, which equal $V_{DD}$. Thus, the capacitor $C_{n-2}$ receives $V_{DD}$ at its upper electrode and ground at its lower electrode, polarizing the capacitor at $+P_1$; note, however, the effect of the loop on the capacitor above capacitor $C_{n-2}$, that is, at capacitor $C_{n-1}$. For that capacitor, both its upper and lower electrodes are now at $V_{DD}$, so the voltage across the capacitor, formerly at $V_{DD}$ for the immediately preceding iteration of x=n, is now switched to 0 volts. According to the hysteresis response of FIG. 4, therefore, the polarization across the capacitor will recede in magnitude, but not change polarity, from $+P_1$ to $+P_2$. Hence, for the iteration of method 700 when x=n−1, the polarization of capacitor $C_{n-1}$ is $+P_2$, while the polarization of capacitor $C_{n-2}$ is $+P_1$.

Figure 8C:
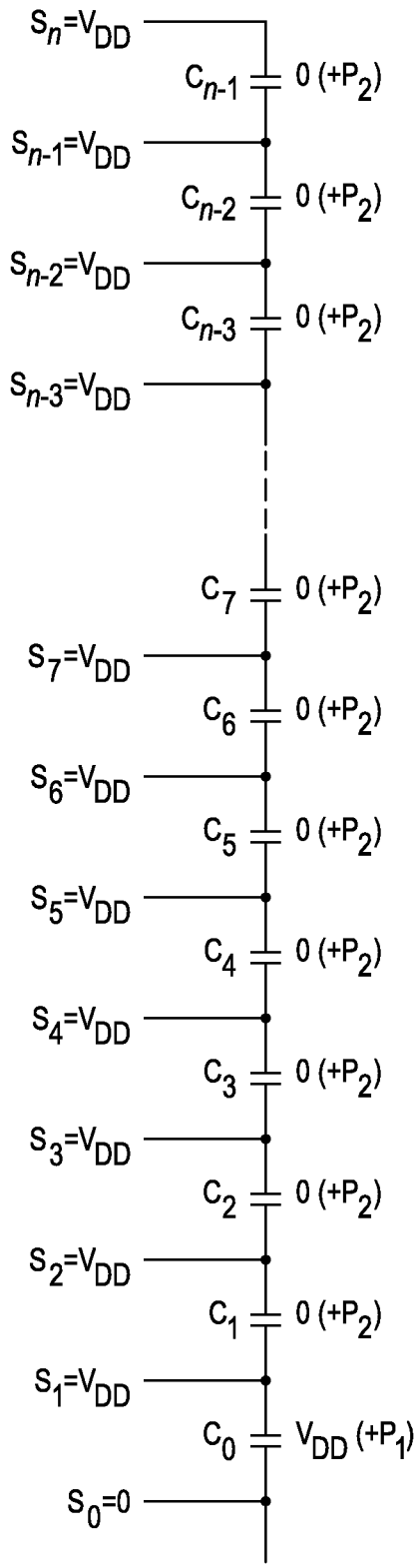
Figure 8D:
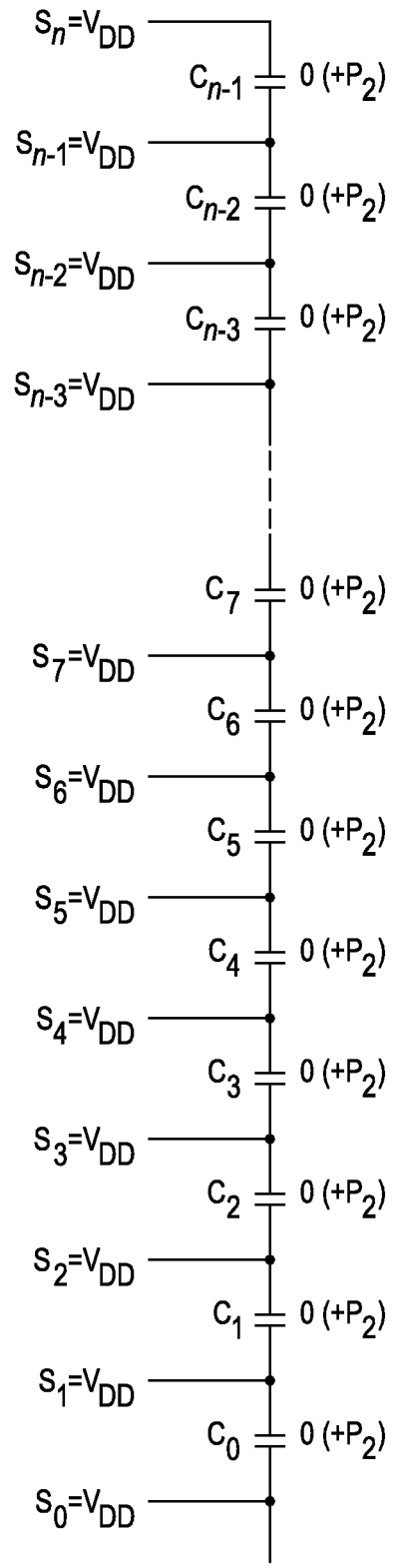

Given the preceding, one skilled in the art will appreciate that for each successive loop iteration x of method 700, one additional capacitor in the serially-connected stack 30, compared to the immediately preceding iteration x+1, will achieve a polarization of $+P_1$, with each capacitor above that additional capacitor having achieved a polarization of $+P_2$. FIG. 8C, by way of example, therefore illustrates the loop iteration for x=1, in which case the poling signal in a first subset of $S_0$ equals zero, while the remaining poling signals in the second subset, namely $S_1$ to $S_n$, equal $V_{DD}$. Thus, following those n−1 loop iterations, all capacitors $C_1$ through $C_{n-1}$ will be polarized to $+P_2$, while capacitor $C_0$ will be polarized to $+P_1$. Further, for the iteration of x=1, then step 706 is still not yet satisfied, so step 708 is repeated one more time to decrement x=0 and step 704 is repeated, with the result being that illustrated in FIG. 8D. Specifically, in this final loop iteration of method 700, wherein x=0, then all poling signals in a first subset from $S_0$ to $S_n$ equal $V_{DD}$, while the remaining subset is the null set, as there are no additional poling signals having an index less than 0. Further, therefore, in this iteration for x=0, $S_0=V_{DD}$, whereas in the immediately preceding iteration of x=1 then $S_0=0$, so whereas capacitor $C_0$ was polarized to $+P_1$ for the iteration of x=1 in response to a voltage across it of $V_{DD}$, when x=0 then the voltage of $S_0=S_1=V_{DD}$ decreases the voltage across capacitor $C_0$ from $V_{DD}$ to zero, thereby causing it to polarize, as indicated by the response curve in FIG. 4, to a polarization of $+P_2$, that is, it remains positively polarized, and is now polarized in a same direction and same magnitude as all other capacitors in stack 30.

From the above, one skilled in the art should appreciate that method 700 commences with 0 volts across each capacitor in stack 30, and then from a direction in descending index x for capacitor $C_x$ in the capacitors $C_{n-1}$ down to $C_0$, then one capacitor a time and for that index is biased to a first polarity having a first magnitude and a first direction, and then in a successive descent of the index of x−1 that same capacitor is further biased to maintain that same first direction, albeit changing, potentially, by some difference in magnitude. Given that the sequence of such changing biases may be perceived as from the top of stack 30 (i.e., as to capacitor $C_{n-1}$, closest to output $v_{out}$), in a downward direction in the schematic sense of stack 30 (i.e., toward bottom capacitor $C_0$, the bottom electrode of which is connected to receive poling signal $S_0$), then the process may be perceived as akin to a downward zipper of values, where each decrementing step of the zipper is the new application of $V_{DD}$ to a selected capacitor upper electrode, thereby moving that capacitor to a positive polarity while ensuring the capacitor(s) above the selected capacitor also maintain a likewise, and earlier, established positive polarity. Accordingly, as the figurative zipper moves down, the magnitude of the polarization across each capacitor may recede, but it will not change state (i.e., from positive to negative or vice versa) by virtue of the sequencing of the preferred embodiment. As a result, upon completion of method 700, all capacitors in the stack have co-aligned directionality of polarization.

Figure 9:
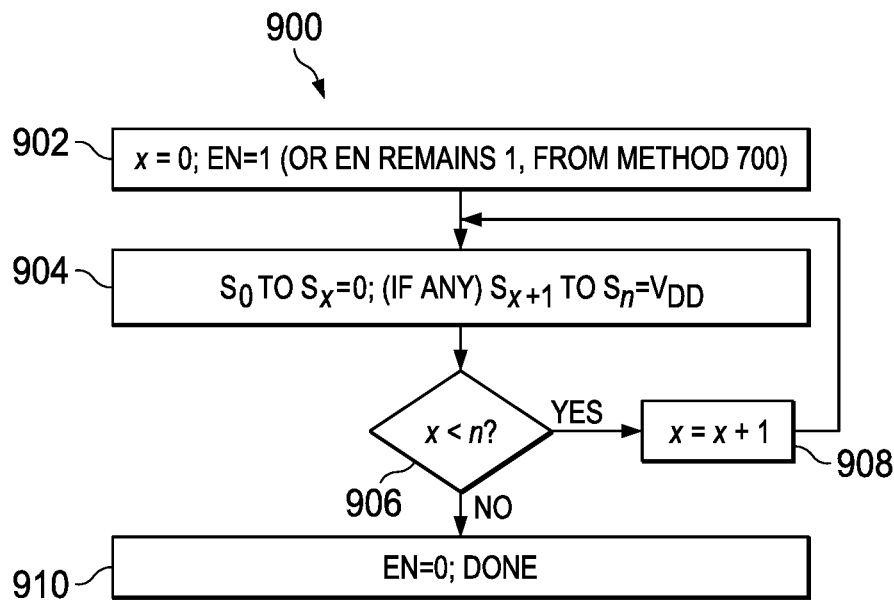
FIG. 9 illustrates a preferred embodiment method that may be used in a polarization mode of the FIG. 1 sensor to maintain the second polarity direction and establish a fourth polarization magnitude.

With FIGS. 7 and 8A through 8D having illustrated a downward "zipping" of polarization of the serial-connected capacitors along stack 30, FIG. 9 illustrates a method 900, and FIGS. 10A through 10D examples of sequencing in method 900, of the upward zipping to maintain the polarity achieved in method 700, while advancing in an opposite direction as compared to the above-described sequencing of method 500 relative to method 200. Thus, whereas method 500 sequenced downward and, when complete, equally biased each capacitor electrode at ground and maintained negative polarity and the magnitude receded from $-P_1$ to $-P_2$ as compared to method 200, then method 900 also sequences upward yet, when complete, maintains positive polarity and the magnitude recedes from $+P_1$ to $+P_2$. Also with method 900, like method 500, each capacitor, in sequential fashion along the serial-connected stack, is singularly discharged in a controlled fashion to thereby conclude with 0 volts at both its upper and lower electrode, providing a controlled, ordered operation so as to reduce the possibility of a reversal of the positive polarization of each capacitor in the stack. Accordingly, one skilled in the art is presumed to have understood the earlier method descriptions, from which the flow of method 900, and the resultant exemplary sequences of FIGS. 10A through 10D, should be readily understandable.

Figure 11:
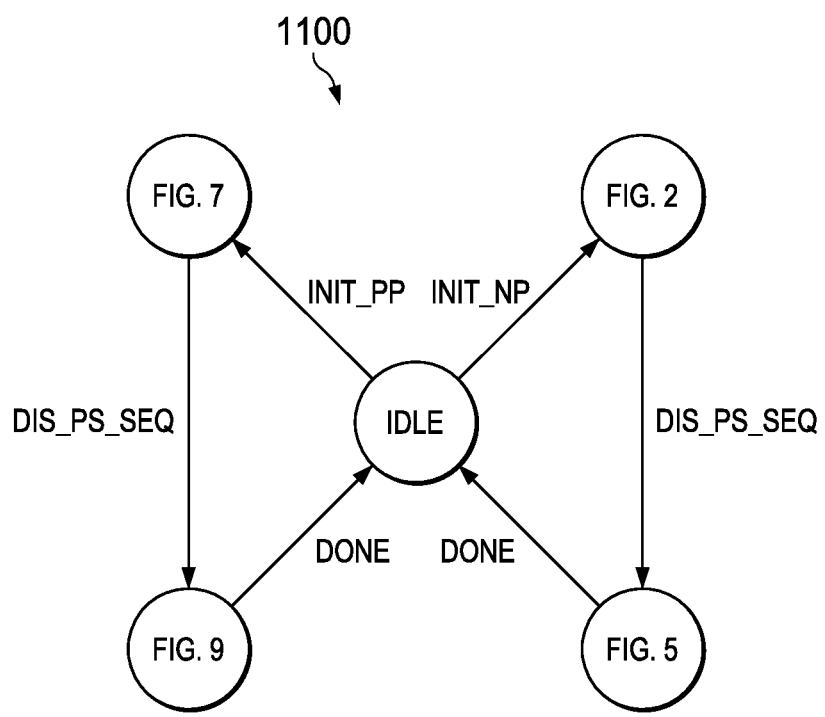
FIG. 11 illustrates a state diagram of a preferred embodiment for polarizing the ferroelectric capacitors in FIG. 1.
Figure 10A:
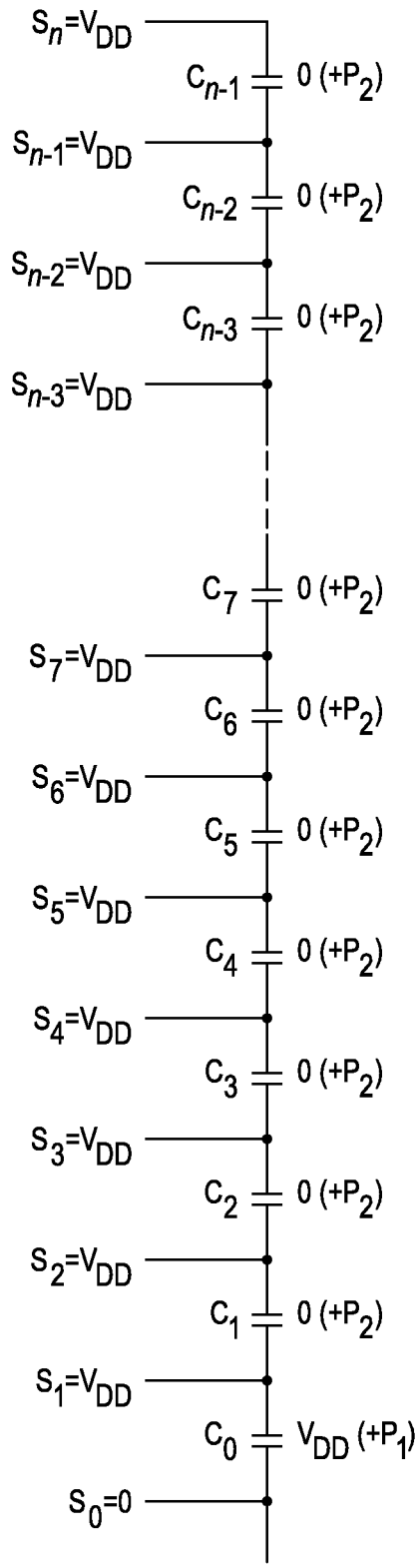
Figure 10B:
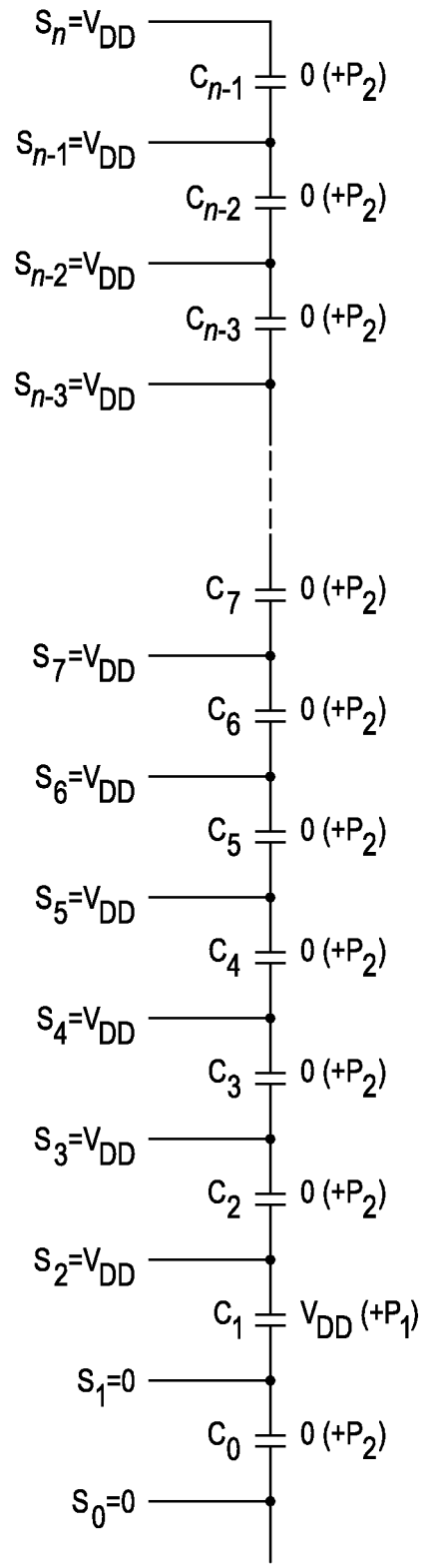

FIG. 11 illustrates a state diagram 1100 of a preferred embodiment for polarizing the ferroelectric capacitors in stack 30, given an understanding of the prior discussions. By way of introduction, therefore, the state diagram may be implemented as part of INIT FSM 22 of precondition circuit 20 shown in FIG. 1, although other approaches for sequential operations are contemplated and may be selected by one skilled in the art. In diagram 1100, INIT FSM 22 may commence in an IDLE state, from which polarization of the stack 30 capacitors can be initiated for either negative polarization by asserting INIT_NP or for positive polarization by asserting INIT_PP. For example, when INIT_NP is asserted to commence negative polarization, state machine 1100 transitions to a FIG. 2 state, so as to perform method 200 as described earlier to sequentially establish a polarization of $-P_2$ across each stack 30 capacitor. Once method 200 is complete, a next transition is achieved by asserting DIS_PS_SEQ so as to transition to a FIG. 5 state, so as to perform method 500 as described earlier to sequentially discharge each poling signal and ultimately maintain a polarization of $-P_2$ across each stack 30 capacitor, and once method 500 is done state machine 1100 returns to the IDLE state. As another example from the IDLE state, when INIT_PP is asserted to commence positive polarization, state machine 1100 transitions to a FIG. 7 state, so as to perform method 700 as described earlier to sequentially establish a polarization of $+P_2$ across each stack 30 capacitor. Once method 700 is complete, a next transition is achieved by asserting DIS_PS_SEQ so as to transition to a FIG. 9 state, so as to perform method 900 as described earlier to sequentially discharge each poling signal and ultimately maintain a polarization of $+P_2$ across each stack 30 capacitor, and once method 900 is done state machine 1100 returns to the IDLE state.

Figure 12:
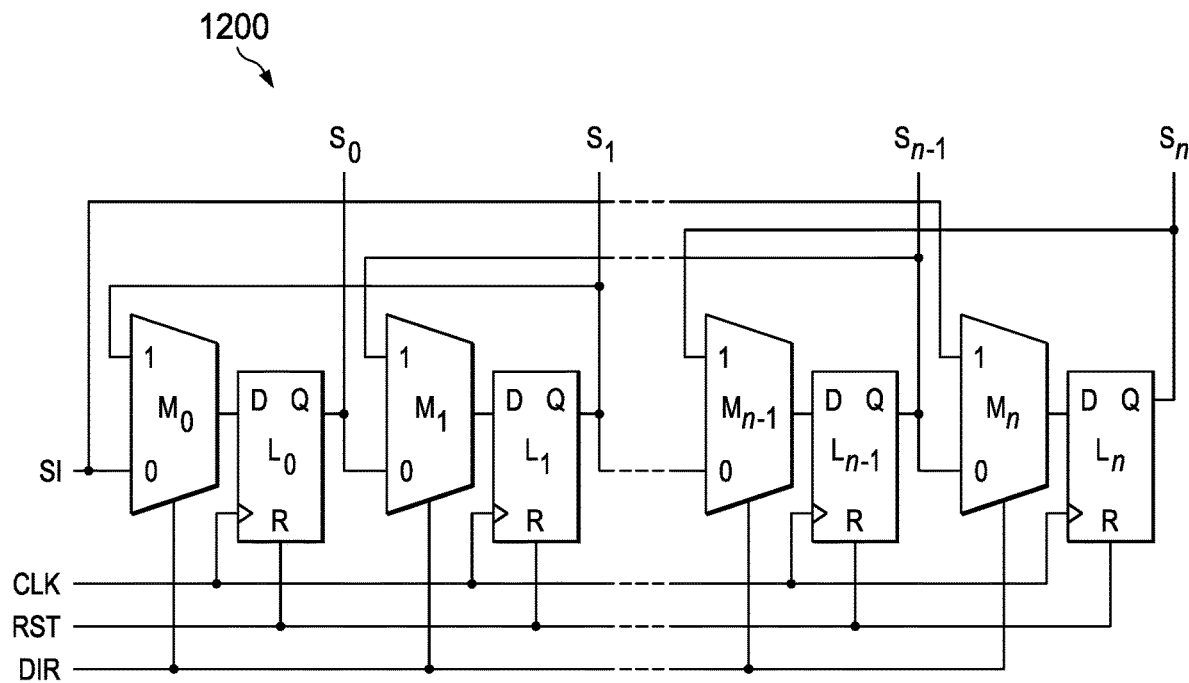
FIG. 12 illustrates a schematic of preferred embodiment shift register that may be used for providing the poling signals $S_0$ through $S_n$ in FIG. 1.

FIG. 12 illustrates a schematic of preferred embodiment shift register 1200 that may be used for providing the n+1 poling signals $S_0$ through $S_n$ described above, for example with any one or more of the non-IDLE states in FIG. 11.

Shift register 1200 includes n+1 flip flops $L_0$ through $L_n$, where the data (D) input of each flip flop $L_x$ is connected to an output of a respective multiplexer $M_0$ through $M_n$, and where each multiplexer $M_x$ has a "1" input connected to a data (Q) output of a next flip flop in the sequence of flip flops (e.g., the Q output of flip flop $L_1$ is connected to the "1" input of multiplexer $M_0$), with the exception of multiplexer $M_n$ which has its "1" input connected to receive a signal input (SI). Further, each multiplexer $M_x$ has its "0" input connected to the data (Q) output of the preceding flip flop (e.g., the Q output of flip flop $L_0$ is connected to the "0" input of multiplexer $M_1$), with the exception of multiplexer $M_0$ which has its "0" input connected to receive the signal input SI. All flip flops $L_0$ through $L_n$ are clocked by a single clock signal CLK and may be reset by a single reset signal RST. Lastly, each multiplexer chooses its output, between its "1" and "0" inputs, in response to a direction DIR signal.

The operation of shift register 1200 should be readily understood by one skilled in the art given the general nature of its logic design, as well as the sequencing shown in FIGS. 2, 5, 7, and 9. Accordingly, below is a brief description of a few examples, from which one skilled in the art should be readily enabled in connection with aspects of the inventive scope.

Briefly describing the operation of shift register 1200 in connection with method 200 of FIG. 2 and that same state in FIG. 11, then such operation is achieved by setting DIR=0 and SI=1. Thus, following assertion of RST in which case flip flops $L_0$ through $L_n$ output respective all polling signals $S_0$ through $S_n$ equal to 0, then for a subsequent first clock cycle, the value of SI=1 is selected by multiplexer $M_0$, registered into flip flop $L_0$, and output as poling signal $S_0$, while the remaining flip flops $L_1$ through $L_n$ register the value of 0 from the immediately-preceding cycle outputs of flip flops $L_0$ through $L_{n-1}$, thereby outputting poling signals $S_1$ through $S_n$ equal to zero, consistent therefore with FIG. 3A. Note also that, in the digital domain therefore, the value of $S_0=1$ in a binary sense accomplishes the same biasing shown in FIG. 3A as $V_{DD}$, that is, the binary 1 is equivalent to the application of a $V_{DD}$ voltage. For a second clock cycle following the first clock cycle, multiplexer $M_0$ and flip flop $L_0$ again select and register an output of $S_0=1$, while at the same time the prior clock cycle value of $S_0=1$ is selected by multiplexer $M_1$, registered into flip flop $L_1$, and output as poling signal $S_1$, while the remaining poling signals $S_2$ through $S_n$ equal zero (see, e.g., FIG. 3B). This process repeats for each successive clock cycle, until all of $S_0$ through $S_n$ equal 1 (see, e.g., FIG. 3D), as detailed earlier, thereby completing method 200 (and its respective state in FIG. 11).

As another example, now described is the operation of shift register 1200 in connection with method 500 of FIG. 5 and that same state in FIG. 11 as following method 200, where such operation is achieved by setting DIR=1 and SI=0. Here, without a preceding assertion of RST, recall that following the preceding method 200, all poling signals $S_0$ through $S_n$ equal $V_{DD}$ (i.e., logic 1). In a first clock cycle, and in response to DIR=1, then each multiplexer $M_x$ selects the data at its "1" input, in and more particularly, therefore, each multiplexer $M_x$ selects the output of the flip flop at the next higher index of x+1, with the exception of multiplexer $M_n$, which selects, at its "1" input, the value of SI=0. For this clock cycle, therefore, each of flip flops $L_0$ through $L_{n-1}$ respectively output $S_0$ through $S_{n-1}$ equal to 1, whereas flip flop $L_n$ outputs $S_n=0$, consistent therefore with FIG. 6A. For a second clock cycle following the first clock cycle, again multiplexer $M_n$, selects the value of SI=0 at its "1" input which is again output by flip flop $L_n$ as poling signal $S_n=0$, and at the same time multiplexer $M_{n-1}$ selects the immediately prior clock cycle value of 0 output from flip flop $L_n$ at its "1" input, which is output by flip flop $L_{n-1}$ as poling signal $S_{n-1}$, while the remaining poling signals $S_0$ through $S_{n-2}$ equal one. This process repeats for each successive clock cycle, until all of $S_0$ through $S_n$ equal 0, as detailed earlier, thereby completing method 500 (and its respective state in FIG. 11).

Given the preceding, one skilled in the art will further appreciate the operation of shift register 1200 so as to likewise accomplish method 700 of FIG. 7 by setting DIR=1 and SI=1, and to accomplish method 900 of FIG. 9 by setting DIR=0 and SI=0.

Figure 13:
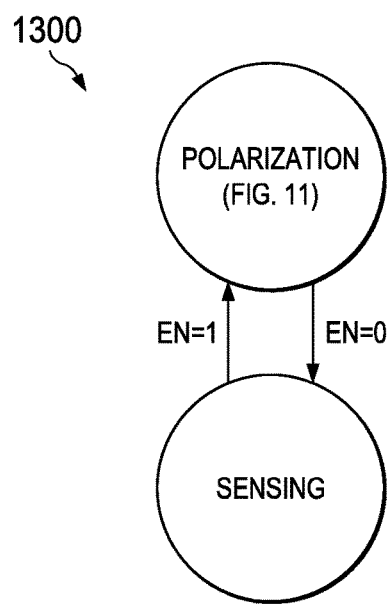
FIG. 13 illustrates a state diagram of two different modes of operation of the FIG. 1 sensor.

FIG. 13 illustrates a state diagram 1300 of the two different modes of sensor 10 introduced earlier in connection with FIG. 1, where each mode is shown as a state, those modes being: (1) a polarizing mode; and (2) a sensing mode. Such modes now may be further appreciated in view of the details that have been provided regarding various circuit elements and operation.

In the polarizing mode, EN=1 so as to close all of the low leakage switches $LLS_x$, and to open switches $S_{LS}$ and $S_{US}$, where the closed switches $LLS_0$ through $LLS_n$, respectively, connect the poling signals $S_0$ through $S_n$ to respective electrode nodes of capacitor stack 30. As shown in FIG. 13, polarizing includes one or more of the states of FIG. 11, where as now has been detailed each capacitor in the serial-connected stack 30 is sequentially polarized to a same magnitude and polarity, in either a direction from the bottom of the stack upward, or the top of the stack downward, preferably followed by a controlled and sequential discharge of each such capacitor, while maintaining the polarization polarity. Optionally, the polarization state of FIG. 13 may be repeated one or more times, either in connection with the device manufacturer, or later, including once sensor 10 is implemented and/or positioned and operating as part of a larger device or system. In any event, therefore, the precondition polarizing mode may consist of repeated cycles of alternating INIT_NP and INIT_PP assertions. Such cycles will drive the hysteresis loop in FIG. 4 to a more desirable steady state (larger remnant polarization) and greater stability over time (age) and temperatures. Such re-conditioning would be preferable, for example, when: (i) calibration suggests sensitivity reduction; (ii) after high temperature (e.g., >100 C) exposure; or (iii) as time-based periodic maintenance, which could vary from daily to monthly, or even longer durations between pre-conditioning (including reconditioning) events.

Preferably after at least one instance of the polarization mode, sensor 10 may be operated in the sensing mode, where EN=0, so as to open all of the low leakage switches $LLS_x$, and to close switches $S_{LS}$ and $S_{US}$, whereby the closed switch $S_{LS}$ connects the lower electrode of capacitor $C_0$ to VREF and the closed switch $S_{US}$ connects the upper electrode of capacitor $C_{n-1}$, that is, the output $30_{out}$ of the entire capacitor stack 30, to the inverting input of amplifier 42. With switch $S_{RES}$ also open in the sensing mode, then amplifier 42 is thereby capacitively connected in a negative feedback fashion, so as to bring its input voltages toward an equilibrium and to provide an output signal, $v_{out}$, proportionate to the voltage ratio of voltage across capacitor $C_{FB}$ and the voltage across capacitor stack 30. Thus, as the capacitors in stack 30 experience piezoelectric- or pyroelectric-responsive parameters (e.g., stress, temperature, vibration, and the like), the voltage across stack 30 changes as does the sensor 10 output signal $v_{out}$, thereby providing a measure from sensor 10 proportionate to that parameter(s).

Figure 14:
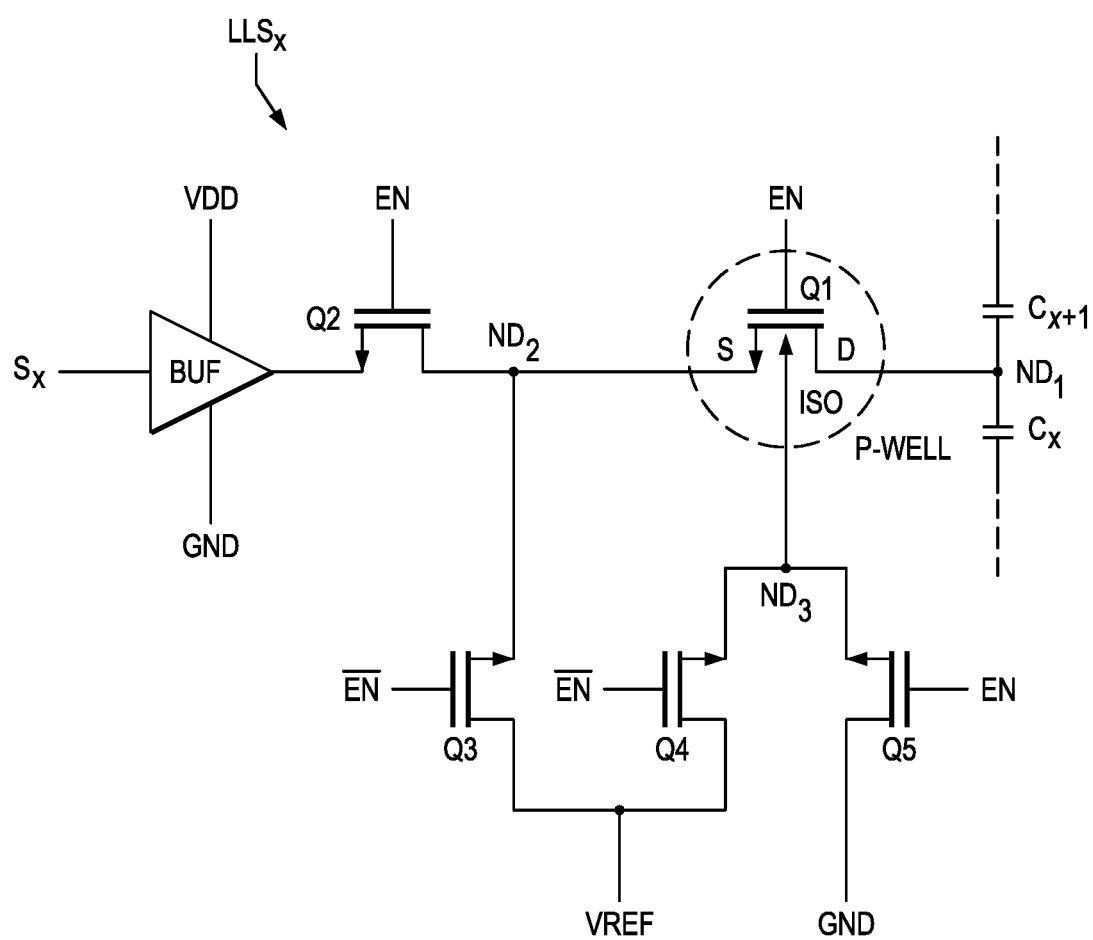
FIG. 14 illustrates a schematic of a preferred embodiment for each low leakage switch $LLS_0$ through $LLS_n$ in FIG. 1.

FIG. 14 illustrates a schematic of a preferred embodiment for each low leakage switch $LLS_0$ through $LLS_n$ in FIG. 1. As suggested by the descriptor of low leakage, each such switch is constructed so as to minimize leakage from the respective capacitor stack node to which the switch is connected, so that in the sensor mode, any relatively small change in charge across the capacitor stack 30, and arising from force on stack 30, is preserved for purposes of an accurate sensed output voltage $v_{out}$. Thus, such voltage is preferably undisturbed by any leakage path back through the poling circuitry, that is, such circuitry is also isolated during the sensing mode.

Now discussing switch $LLS_x$ in greater detail, a node $ND_1$, between any two capacitors $C_x$ and $C_{x+1}$ of stack 30, is connected to the drain of a transistor Q1, an isolated NMOS transistor. The gate of transistor Q1 is connected to the EN signal, the source of transistor Q1 is connected to a node $ND_2$, and the backgate of transistor Q1 is connected to a node $ND_3$. Node $ND_2$ is further connected to the drain of a transistor Q2, the gate of transistor Q2 is connected to the EN signal, and the source of transistor Q2 is connected to an output of a buffer $B_x$, where the buffer was introduced earlier in connection with FIG. 1. Node $ND_2$ is further connected to a source of a transistor Q3, which has its gate connected to $\overline{EN}$ and its drain connected to VREF. Node $ND_3$ is further connected to a source of a transistor Q4, which has its gate connected to $\overline{EN}$ and its drain connected to VREF. Lastly, node $ND_3$ is further connected to a source of a transistor Q5, which has its gate connected to EN and its drain connected to ground.

The operation of low leakage switch $LLS_x$ is now described. In sensing mode (e.g., see state in FIG. 13), EN=0 which disables or opens transistor Q1 while at the same time $\overline{EN}=1$ enables transistor Q4, thereby connecting the transistor Q1 backgate to VREF, and simultaneously $\overline{EN}=1$ enables transistor Q3, thereby connecting the source of transistor Q1 to VREF, that is, putting the potential leakage paths of transistor Q1 to the same VREF potential as in the capacitor sensor, in which case there is no current flow (i.e., leakage) due to the multiple nodes all at VREF. Hence, the low leakage switch (and other like switches) isolates the serial-connected capacitors of stack 30 from any poling signal or circuitry associated therewith, thereby isolating the charge on those capacitors from leaking and providing a robust signal for $30_{vout}$. In the polarization mode, EN=1 which enables or closes transistors Q1 and Q2, so buffer $B_x$ can drive a poling signal $S_x$ along the source/drain paths of those devices to the respective node in capacitor stack 30. Also during the polarization mode, the value EN=1 enables transistor Q5 so as to connect ground to the p-well of transistor Q1, so as to provide full conductance to Q1.

From the above, various preferred embodiments provide improved piezoelectric apparatus and methods. Various preferred embodiments have various respects and/or benefits. For example, a precondition circuit (e.g., state machine) pre-conditions the sensor material (e.g., piezoelectric) so as to maximize and stabilize sensitivity over time and temperature. As another benefit, a self-biasing amplifier minimizes leakage to extend low frequency performance range (as compared to complicated charge amplifier circuits). As still another example, preferred embodiments may provide a full solution on a single semiconductor (e.g., silicon) integrated circuit chip. As another example, preferred embodiment provides an integrated silicon device that includes a piezoelectric-based sensor array, sensor pre-condition, ultra-low leakage switches and signal amplification for strain-change detection, as a single silicon solution that may replace a sensor (sometimes discrete) and AFE signal chain. Thus, preferred embodiments also facilitate reduced power consumption and can avoid off-chip and input/output related parasitics. As still another example, preferred embodiments provide the ability to re-condition sensing material (e.g., PZT) to compensate for various effects, including the passage of time and changes in temperature. Thus, the preferred embodiments have been shown to have numerous benefits, and various embodiments have been provided. Accordingly, while various alternatives have been provided according to the disclosed embodiments, still others are contemplated and yet others may be ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A piezoelectric sensor, comprising:
an integrated circuit comprising:
 a substrate;
 a capacitive element affixed relative to the substrate, the capacitive element comprising piezoelectric material;
 a preconditioning circuit affixed relative to the substrate, the preconditioning circuit configured to establish a polarization of the capacitive element in a polarizing mode; and
 signal amplification circuitry affixed relative to the substrate, the signal amplification circuitry configured to provide a piezoelectric-responsive output signal responsive to a charge across the capacitive element in a sensing mode.

2. A piezoelectric sensor, comprising:
a capacitive element comprising serially-connected piezoelectric capacitors;
a preconditioning circuit configured to establish a polarization of the capacitive element in a polarizing mode; and
signal amplification circuitry configured to provide a piezoelectric-responsive output signal responsive to a charge across the capacitive element in a sensing mode.

3. The sensor of claim 2, wherein the preconditioning circuit is configured to establish a same polarization of the serially-connected piezoelectric capacitors at a separate time per capacitor.

4. The sensor of claim 2, wherein the preconditioning circuit is configured to establish a same polarization of the serially-connected piezoelectric capacitors at a separate time per capacitor and along a sequential direction in the serially-connected piezoelectric capacitors.

5. The sensor of claim 2, wherein the preconditioning circuit is configured to:
establish a polarization polarity and a first polarization magnitude of the serially-connected piezoelectric capacitors at a separate time per capacitor and along a first sequential direction in the serially-connected piezoelectric capacitors; and
maintain the polarization polarity, and establish a second polarization magnitude of the serially-connected piezoelectric capacitors at a separate time per capacitor and along the first sequential direction, in which the second polarization magnitude differs from the first polarization magnitude.

6. The sensor of claim 5, wherein:
the preconditioning circuit is configured to apply a non-zero voltage to the serially-connected piezoelectric capacitors and
the sensor further comprises circuitry configured to change the non-zero voltage to a zero voltage at a separate time per capacitor along a second sequential direction opposite the first sequential direction.

7. The sensor of claim 5, wherein:
the serially-connected piezoelectric capacitors consist of an integer N of piezoelectric capacitors; and
$3 \leq N \leq 64$.

8. The sensor of claim 5, wherein:
the serially-connected piezoelectric capacitors consist of an integer N of piezoelectric capacitors;
the preconditioning circuit comprises an integer number N+1 signal paths coupled to the capacitive element; and
the N+1 signal paths are configured to couple a poling signal to respective different terminals in the serially-connected piezoelectric capacitors.

9. The sensor of claim 8 wherein the N+1 signal paths comprise respective switches configured to be enabled during the polarizing mode and to be disabled during the sensing mode.

10. The sensor of claim 9, wherein:
the serially-connected piezoelectric capacitors are connected to a reference voltage during the sensing mode; and
the switch comprises:
 a first transistor comprising a drain connected to a respective terminal in the serially-connected piezoelectric capacitors;
 a second transistor configured to bias a backgate of the first transistor to the reference voltage during the sensing mode; and
 a third transistor configured to bias a source of the first transistor to the reference voltage during the sensing mode.

11. The sensor of claim 2, wherein the preconditioning circuit is configured to:
establish a first polarization polarity and a first polarization magnitude of the serially-connected piezoelectric capacitors at a separate time per capacitor and along a first sequential direction in the serially-connected piezoelectric capacitors;
maintain the first polarization polarity, and establish a second polarization magnitude of the serially-connected piezoelectric capacitors at a separate time per capacitor and along the first sequential direction;
establish a second polarization polarity and a third polarization magnitude of the serially-connected piezoelectric capacitors at a separate time per capacitor and along a second sequential direction in the serially-connected piezoelectric capacitors, in which the second polarization polarity is opposite the first polarization polarity, and the second sequential direction is opposite the first sequential direction; and
maintain the second polarization polarity, and establish a fourth polarization magnitude of the serially-connected piezoelectric capacitors at a separate time per capacitor and along the second sequential direction in the serially-connected piezoelectric capacitors.

12. The sensor of claim 11, wherein the preconditioning circuit is configured to:
apply a non-zero voltage along the second sequential direction in the serially-connected piezoelectric capacitors; and the sensor further comprises circuitry configured to change the non-zero voltage to a zero voltage at a separate time per capacitor along the second sequential direction in the serially-connected piezoelectric capacitors.

13. The sensor of claim 11, wherein:
the serially-connected piezoelectric capacitors consist of an integer N of piezoelectric capacitors; and
$3 \leq N \leq 64$.

14. The sensor of claim 11, wherein the second polarization magnitude equals the fourth polarization magnitude.

15. The sensor of claim 11, wherein the second polarization magnitude does not equal the fourth polarization magnitude.

16. The sensor of claim 11, wherein:
the serially-connected piezoelectric capacitors consist of an integer N of piezoelectric capacitors;
the preconditioning circuit comprises an integer number N+1 signal paths coupled to the capacitive element; and
the N+1 signal paths are configured to couple a poling signal to respective different terminals in the serially-connected piezoelectric capacitors.

17. The sensor of claim 16, wherein the N+1 signal paths comprise respective switches configured to be enabled during the polarizing mode and to be disabled during the sensing mode.

18. The sensor of claim 17, wherein:
the serially-connected piezoelectric capacitors are connected to a reference voltage during the sensing mode; and
the switch comprises:
a first transistor comprising a drain connected to a respective terminal in the serially-connected piezoelectric capacitors;
a second transistor configured to bias a backgate of the first transistor to the reference voltage during the sensing mode; and
a third transistor configured to bias a source of the first transistor to the reference voltage during the sensing mode.

19. A method of operating a piezoelectric sensor, the sensor comprising a capacitive element, comprising serially-connected piezoelectric capacitors, the method comprising:
before sensing, establishing a polarization of the capacitive element in a polarizing mode by polarizing the serially-connected piezoelectric capacitors, one at a time; and
after establishing the polarization, sensing a response by amplifying a piezoelectric-responsive output signal responsive, to a charge across the capacitive element.

20. The method of claim 19 wherein the establishing comprises polarizing the serially-connected piezoelectric capacitors along a sequential direction in the serially-connected piezoelectric capacitors.

* * * * *